US006696818B2

United States Patent
Arai et al.

(10) Patent No.: US 6,696,818 B2
(45) Date of Patent: Feb. 24, 2004

(54) METHOD AND UNIT FOR COMPUTING CHARGING EFFICIENCY AND CHARGED ELECTRICAL QUANTITY OF BATTERY

(75) Inventors: Youichi Arai, Shizuoka (JP); Shuji Satake, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/262,889

(22) Filed: Oct. 3, 2002

(65) Prior Publication Data

US 2003/0067282 A1 Apr. 10, 2003

(30) Foreign Application Priority Data

Oct. 4, 2001 (JP) ......................................... 2001-309195

(51) Int. Cl.[7] ............................................. H01M 10/46
(52) U.S. Cl. ...................................... 320/132; 324/430
(58) Field of Search ................................ 324/426, 430, 324/432, 433; 320/132, 149

(56) References Cited

U.S. PATENT DOCUMENTS 5,808,443 A * 9/1998 Lundstrom

* cited by examiner

Primary Examiner—Edward H. Tso
(74) Attorney, Agent, or Firm—Armstrong, Kratz, Quintos, Hanson & Brooks, LLP

(57) ABSTRACT

A charging efficiency, which is a ratio of an electrical quantity charged in a battery as an electromotive force to a total electrical quantity supplied to the battery, is computed at a plurality of measuring points between a start and an end of charging of the battery. A resistance difference of the battery between a resistance at the charge start point and a resistance at one of the measuring points is obtained, and a full charged state resistance is obtained at a full charged state of the battery. By using a ratio of the resistance difference to the full charged state resistance, a charging efficiency of the battery is computed at the one of the measuring points. The battery is in an active state where no passivating film is formed on poles of the battery. A charged electrical quantity of the battery is obtained based on the charging efficiencies sequentially obtained during the charging of the battery when the battery is in the active state. In the mean time, a charged electrical quantity of the battery is obtained based on an integration of a charging current multiplied by a corresponding charging time during a transition period in which a passivating film remains on the poles of the battery before the charging current sufficiently breaks the passivating film.

8 Claims, 14 Drawing Sheets

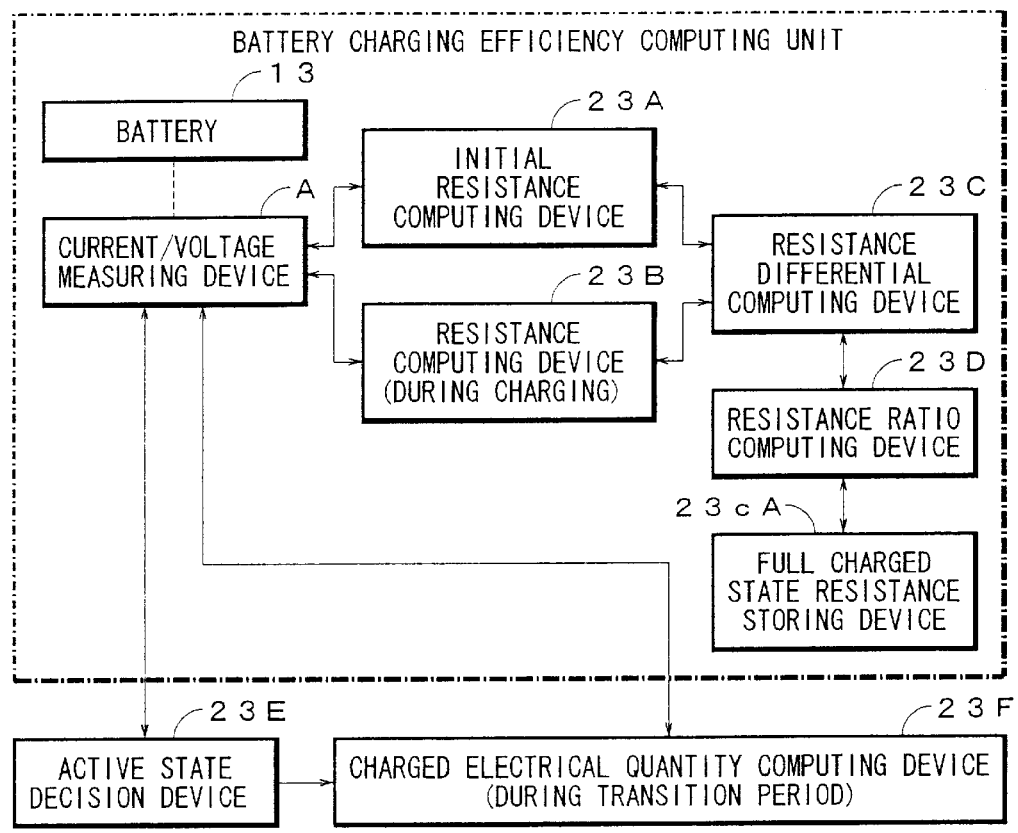
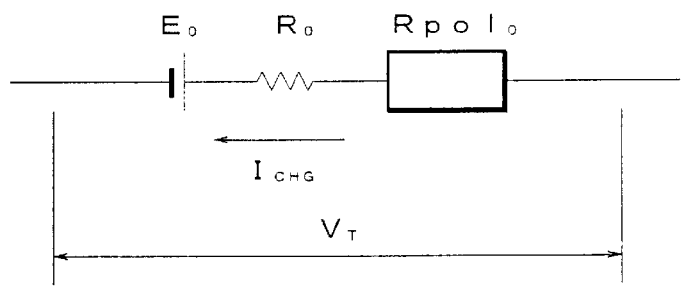
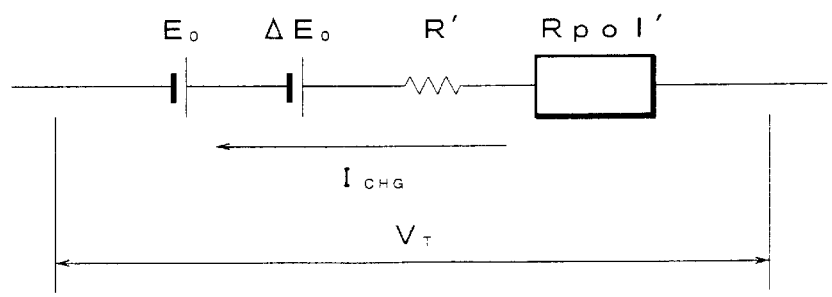

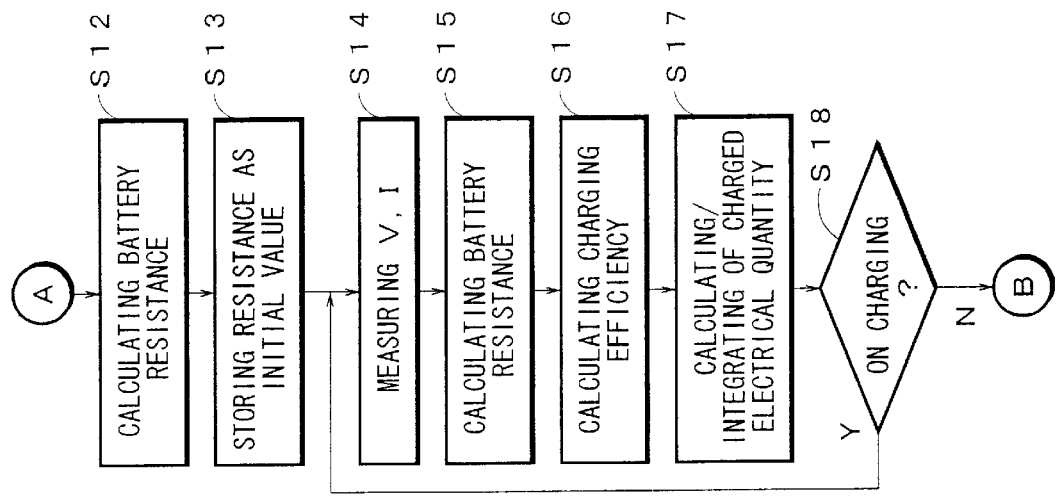
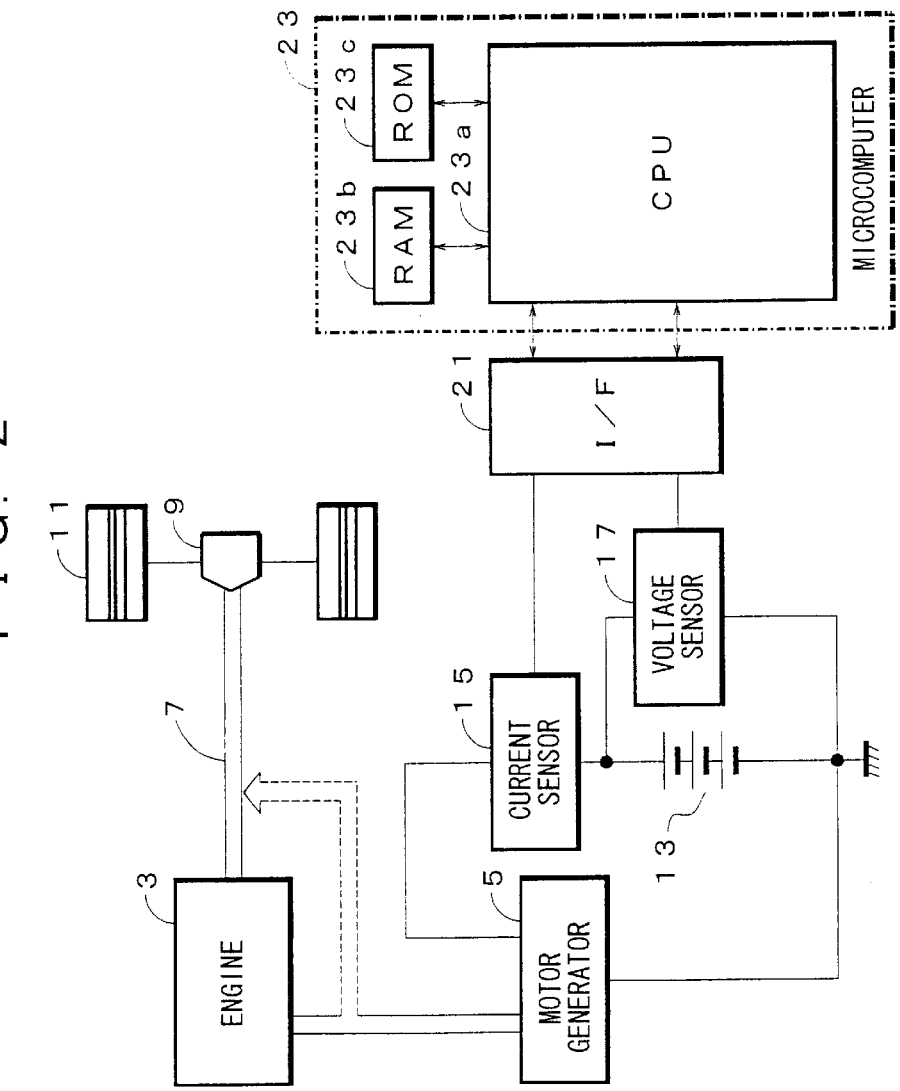

$v = 0.000051x^2 - 0.018176x + 11.852744$

METHOD AND UNIT FOR COMPUTING CHARGING EFFICIENCY AND CHARGED ELECTRICAL QUANTITY OF BATTERY

BACKGROUND OF THE INVENTION

1. Field of the Invention

The present invention relates to a method and a unit for computing a charging efficiency of a battery used for supplying an electrical power to a load at any point between a start and an end of charging of the battery. The charging efficiency is defined as a ratio of an electrical quantity charged in the battery to a total electrical quantity supplied to the battery. The invention also relates to a method and a unit for knowing an electrical quantity charged in the battery based on a plurality of the obtained charging efficiencies.

2. Related Art

For example, in a battery mounted on a motor car, particularly in an electric car having an electric motor as a primary driving unit, it is greatly important to monitor a state of charge (SOC) of the battery to ensure a normal operation condition of the car.

Recently, in a general car having an engine as a driving unit or in a hybrid car having an electric motor for providing an additional driving force to an engine, it has been developed to have an idling function during an engine stop condition, e.g. when the car must temporally stop at an intersection of roads according to a stop signal.

A car having such an idling function requires a battery which can have a discharging capacity enough for restating its engine after the battery has discharged a considerable amount of electrical power for driving a power assisting motor (cell motor) during an idling operation of the car.

Therefore, it is greatly important to correctly know a state and a remaining discharging capacity of a battery concerning a general car and a hybrid car as well as the electric motor car described above.

In a typical electric car, a battery is charged during a non-usage state of the car, e.g. in a garage. In the meantime, a hybrid car has a motor generator which functions a generator to charge a battery when the car is running by a primary engine. The motor generator can also charge the battery at a deceleration period of the car even when the car is running by the driving force of the motor generator. A general car having only a primary engine charges its battery by an alternator driven by the engine.

Accordingly, regardless of the car type such as an electric car, a general car, or a hybrid car, it is important to correctly know a charged state of its battery, because the charged state varies with a charging operation as well as an electrical power supply to a load.

However, a chemical reaction during charging of a battery generates an oxygen gas and a hydrogen gas which are reduced into $H_2O$, so that an electrical quantity supplied into the battery is not partially used for charging the battery. Furthermore, this tendency is more apparent when the battery gets nearer to its full charged state. Thus, a mere integration of charging currents with corresponding times can not obtain a correct charged state of the battery at a point during the charging of the battery.

The above-mentioned problem is not limited in an on-vehicle battery but also appears in a general battery supplying an electrical power to a load.

SUMMARY OF THE INVENTION

In view of the above-mentioned situation, an object of the invention is to provide a method and a unit for obtaining a charging efficiency of a battery used for supplying an electrical power to a load at any point between a start and an end of charging of the battery. The charging efficiency is defined as a ratio of an electrical quantity charged in the battery to a total electrical quantity supplied to the battery. The invention also provides a method and a unit for correctly computing an electrical quantity charged in the battery. This can correctly know a charged state of the battery at any point of charging of the battery.

For achieving the object, a first aspect of the invention is a method for computing a charging efficiency, which is a ratio of an electrical quantity charged in a battery as an electromotive force to a total electrical quantity supplied to the battery, at any one point in time between a start and an end of charging of the battery, the method comprising:

measuring an initial resistance of the battery at the start of the charging, measuring a voltage and a current between a pair of terminals of the battery at the one point to obtain an inner resistance of the battery at the one point, obtaining a resistance difference which is a difference of the inner resistance at the one point and the initial resistance, and obtaining a ratio of the resistance difference to a full charged state resistance that is a resistance of the battery at a full charged state of the battery, whereby, a charging efficiency of the battery at the one point is computed based on the ratio.

Thus, a voltage and a current are measured between the pair of terminals of the battery at a plurality of measuring points between a start and an end of charging of the battery, to obtain an resistance of the battery at each of the measuring points. Then, a resistance difference, which is a difference of a resistance at the charge start point and a resistance at one of the measuring points, is obtained. Furthermore, a full charged state resistance at a full charged state of the battery is obtained, and a ratio of the resistance difference to the full charged state resistance is obtained to know a charging efficiency of the battery at each of the measuring points during charging of the battery. This can correctly know a charged state of the battery, which would be varied with a gas generated in the battery. That is, the charging efficiency includes a charging loss due to the gas generation varying with a charging stage.

In a second aspect of the invention according to the first aspect, the ratio of the resistance difference to the full charged state resistance is deducted from 1 (one) to provide a charging efficiency at the one point.

Thus, a drop of the charging efficiency from an ideal value can be computed at any point during the charging by using the terminal voltage and the discharging current which are measured during the charging.

A third aspect of the invention is a method for computing a charged electrical quantity of the battery according to the first aspect of the invention, wherein a charged electrical quantity stored in the battery at the charging end of the battery is obtained by using a plurality of the charging efficiencies each obtained at each of a plurality of the measuring points in time between the start and the end of charging of the battery.

In the third aspect of the invention, a charged electrical quantity at any point during charge of the battery is obtained based on the charging efficiencies sequentially obtained over the start and the end of charging of the battery according to the first aspect of the invention.

Thus, an electrical quantity actually charged in the battery as compared with an electrical quantity supplied to the battery is correctly computed at each selected point during a time interval. An integration of the charged electrical quantities from the start to the end of the charging correctly provides a final electrical quantity charged in the battery.

A fourth aspect of the invention is a method for computing a charged electrical quantity according to the first aspect of the invention, wherein the battery has poles that are in an active state where no passivating film is formed on the poles, and whether the poles are in the active state is determined based on a pattern of the charging current varying with time during the charging, the charged electrical quantity charged in the battery being obtained by using a plurality of the charging efficiencies each obtained at each of a plurality of the measuring points in time between the start and the end of charging of the battery when the poles are in the active state, the charged electrical quantity of the battery being obtained based on an integration of a charging current multiplied by a corresponding charging time during a transition period in which a passivating film remains on the poles of the battery before the charging current sufficiently breaks the passivating film.

The battery is not in an active state when a passivating film is formed on poles of the battery at the start of charging of the battery. In the inactive state, a charging current becomes smaller so that no gas is generated in the battery. With the charging operation, the passivating film breaks so that the charging current increases.

Thus, the charged electrical quantity of the battery is obtained based on an integration of the charging current multiplied by a corresponding charging time during a transition period in which the battery is in an inactive state. In the meantime, the charged electrical quantity of the battery is obtained based on the charging efficiencies sequentially obtained over the start and the end of charging of the battery when the battery is in the active state where no passivating film remains on the poles of the battery.

Referring to FIG. 1, a fifth aspect of the invention will be discussed. The invention is a unit for computing a charging efficiency, which is a ratio of an electrical quantity charged in a battery 13 as an electromotive force to a total electrical quantity supplied to the battery, at any one point in time between a start and an end of charging of the battery, the unit comprising:

a measuring device A for measuring a voltage and a current between a pair of terminals of the battery at the one point to obtain an inner resistance of the battery at the one point, an initial resistance computing device 23A for obtaining an inner resistance of the battery at the charging start based on a terminal voltage and the corresponding current which are measured by the measuring device, an on-charging resistance computing device 23B for obtaining an inner resistance of the battery at the one point based on a terminal voltage and a corresponding current which are measured by the measuring device, a resistance difference computing device 23c for obtaining a difference between of the inner resistance at the one point and the initial resistance, a storage device 23cA for storing an inner resistance at a full charged state of the battery, and a resistance ratio computing device 23D for obtaining a ratio of the resistance difference to the full charged state resistance, whereby, a charging efficiency of the battery at the one point is computed based on the ratio.

In the fifth aspect of the invention, the measuring device A measures a voltage and a corresponding current between a pair of terminals of a battery 13 at a plurality of measuring points between a start and an end of charging of the battery. The resistance computing device 23A or 23B obtains a resistance of the battery at each of the measuring points based on the voltages and the corresponding currents between the pair of terminals of the battery. The resistance difference computing device 23C obtains a resistance difference which is a difference of a resistance at the charge start point and a resistance at one of the measuring points. The storing device 23cA stores a reference full charged state resistance at a full charged state of the battery, and the resistance ratio computing device 23D obtains a ratio of the resistance difference to the reference full charged state resistance. This can correctly know a charged state of the battery 13, which would be varied with a gas generated in the battery.

Thus, a battery charging efficiency at any point during the charging is correctly computed by using the terminal voltage and the discharging current which are measured during the charging. The charging efficiency includes a charging loss due to the gas generation varying with a charging stage.

A sixth aspect of the invention is a unit for computing a charging efficiency according to the fifth aspect of the invention wherein the resistance ratio computing device deducts the ratio of the resistance difference to the full charged state resistance from 1 (one) to provide a charging efficiency of the battery at the one point.

Thus, a drop of the charging efficiency from an ideal value can be computed at any point during the charging by using of the terminal voltage and the discharging current which are measured during the charging.

A seventh aspect of the invention is a unit for computing a charged electrical quantity according to the fifth aspect of the invention, wherein a charged electrical quantity stored in the battery at the charging end of the battery is obtained by using a plurality of charging efficiencies each obtained at each of a plurality of sequential points in time between the start and the end of charging of the battery by means of the charging efficiency computing unit.

In the seventh aspect of the invention, a charged electrical quantity at any point during charge of the battery 13 is obtained based on the charging efficiencies sequentially obtained over the start and the end of charging of the battery 13. Thus, an integration of a charged electrical quantity from the start to any point of the charging provides a charged electrical quantity at the charging point, obtaining a correct electrical quantity actually charged in the battery by an electrical power supplied into the battery 13.

Thus, an integration of the charged electrical quantity from the start to the end of the charging provides a final electrical quantity charged in the battery.

An eighth aspect of the invention is a unit for computing a charged electrical quantity according to the fifth aspect of the invention, wherein the battery has poles that are in an active state where no passivating film is formed on the poles, and the charged electrical quantity computing unit further comprises:

an active state determining device 23E for determining whether the poles are in the active state based on a pattern of the charging current varying with time during the charging, the charging current obtained by the measuring device, the charged electrical quantity charged in the battery being obtained by using a plurality of charging efficiencies each obtained at each of a plurality of sequential points in time between the start and the end of charging of the battery when the poles are in the active state, and a charged electrical quantity computing device 23F for obtaining a charged electrical quantity during a transition period in which a passivating film remains on the poles of the battery so that the poles are not in the active state before the charging current sufficiently breaks the passivating film, the charged electrical quantity of the battery being obtained based on an integration of a charging current multiplied by a corresponding charging time during the transition period.

The battery 13 is not in an active state when a passivating film is formed on poles of the battery at the start of charging of the battery. In the inactive state, a charging current becomes smaller so that no decrease of the charging efficiency of the battery due to a gas generated in the battery occurs. With the charging operation, the passivating film breaks so that the charging current increases. The active state determining device 23E determines whether the battery is in the active state based on a pattern of the charging current varying with time.

Thus, the charged electrical quantity of the battery 13 is obtained based on an integration of the charging current with a corresponding charging time during a transition period in which the battery 13 is in an inactive state. Therefore, an electrical quantity charged in the battery is correctly computed during a transition period until the passivating film is completely broken by the supplied current. In the meantime, the charged electrical quantity of the battery 13 is obtained based on the charging efficiencies sequentially obtained over the start and the end of charging of the battery 13 when the battery 13 is in the active state where no passivating film remains on the poles of the battery 13.

BRIEF DESCRIPTION OF THE DRAWINGS

FIG. 1 is a block diagram showing a unit for computing a charging efficiency and a charged electrical quantity of an on-vehicle battery according to the present invention;

FIG. 2 is a schematic block diagram of a unit for obtaining a charged electrical quantity of an on-vehicle battery to which a method for measuring a charging efficiency according to a first embodiment of this invention is applied;

FIG. 4 is a schematic diagram showing an equivalent circuit of the battery at a charging start point;

FIG. 5 is a schematic diagram showing an equivalent circuit of the battery at a point after the charging start;

FIGS. 14 and 15 illustrate a flowchart showing the processing executed by a microcomputer of FIG. 2 in accordance with a predetermined program stored in a ROM of the microcomputer;

DETAILED DESCRIPTION OF THE PREFERRED EMBODIMENTS

Figure 3:
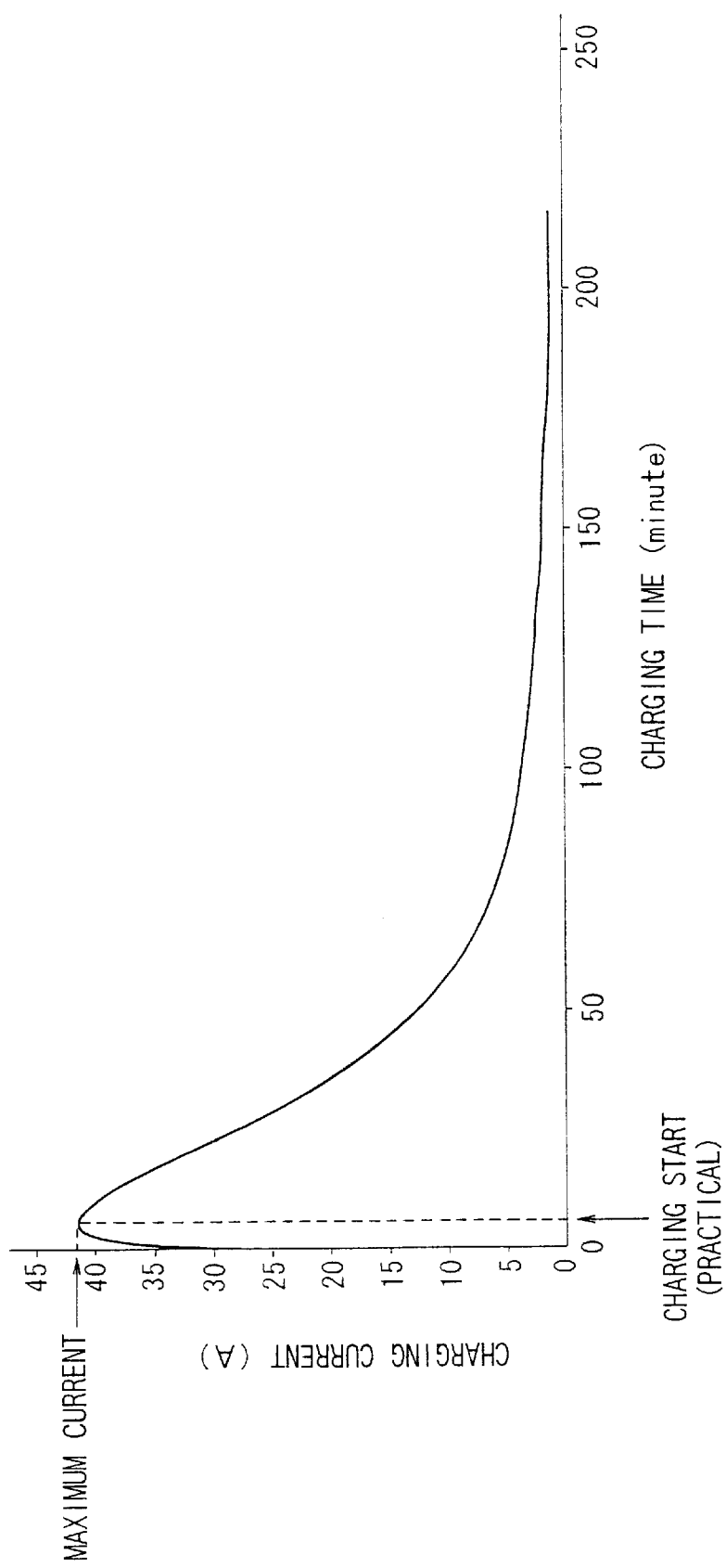
FIG. 3 is a graph showing a relationship between a charging current and a corresponding time.

Referring to the accompanied drawings, a method and a unit for computing a charging efficiency of a battery according to the invention and for knowing an electrical quantity charged in the battery will be discussed.

FIG. 2 is an explanatory view, which is partially a block diagram, to show generally an embodiment of a method and a unit for obtaining a charging efficiency of an on-vehicle battery according to the invention and for knowing an electrical quantity charged in the battery. Reference numeral 1 designates the unit which is mounted on a hybrid car having a motor generator 5 in addition to an engine 3.

In a normal operation of the hybrid car, an output of the engine 3 is transmitted to wheels 11 via a drive shaft 7 and a differential gear box 9 for moving the car. In a high load condition of the car, the motor generator 5 is moved as a motor by an electrical power supplied from the battery 13, and a driving force of the motor generator 5 is delivered to the wheels 11 via the drive shaft 7 in addition to the output of the engine 3.

The motor generator 5 of the hybrid car functions as a generator at a deceleration or braking state of the car for converting a kinetic energy to an electrical power for charging the battery 13 mounted on the car for operating various types of loads.

The motor generator 5 also functions as a cell motor that forcedly rotates a flywheel of the engine 3 at the start of the engine 3 when a starter switch (not shown) is turned on.

In the hybrid car, a first turning step of a key (not shown) received in a cylinder (not shown) turns on accessory switches (not shown), and a second turning step of the key turns on an ignition switch (not shown) while the accessory switches keep their on-states.

Furthermore, a third turning step of the key turns on the starter switch while the accessory switches and the ignition switch keep their on-states.

The releasing of the key which has been in the third step returns the key to the second turning step, which turns off the starter switch. At this stage, the key keeps its position where the accessory switches and the ignition switch keep their on-states unless the key is turned oppositely. At the first stage, the key also keeps its position where the accessory switches keep their on-states unless the key is turned oppositely.

When the motor generator 5 functions as the cell motor, a discharge current of about 250 A (ampere) flows instantaneously from the battery 13 for starting the engine 3 with no other electrical units being working.

The battery charged electrical quantity computing unit 1 of the embodiment has a current sensor 15 and a voltage sensor 17. The current sensor 15 senses, for example, a discharging current I flowing out from the battery 13 to the motor generator 5 when the motor generator 5 functions as the cell motor and a charging current flowing from the motor generator 5 to the battery 13 when the motor generator 5 functions as the generator. The voltage sensor 17 senses a voltage between a pair of terminals of the battery 13. The voltage sensor 17 having an extremely large resistance is connected to the battery 13 in parallel.

The current sensor 15 and the voltage sensor 17 are positioned in a circuit closed when the ignition switch is on.

The battery charged electrical quantity computing unit 1 of the embodiment also has a microcomputer 23 and a nonvolatile memory (NVM) 25. The microcomputer 23 receives outputs from the current sensor 15 and the voltage sensor 17 via an interface circuit 21 (called as I/F) having an A/D converter function.

The microcomputer 23 includes CPU 23a, RAM 23b, and ROM 23c. CPU 23a is connected to RAM 23b, ROM 23c, and I/F 21. CPU 23a receives a signal indicating an on or off state of the ignition switch (not shown)

RAM 23b has a data area for storing various kinds of data and a working area for executing various kinds of processes. ROM 23c stores a control program for making CPU 23a execute the processes. In ROM 23c, a full charged state resistance of the battery 13 has been preliminarily stored. The full charged state resistance is the sum of a pure resistance Rf and a polarization (activation and concentration) resistance Rpolf when the battery 13 is in an initial full charged state.

The ROM 23c of the battery charged electrical quantity computing unit 1 corresponds to the full charged state resistance storing device 23cA described in FIG. 1.

The microcomputer 23 becomes in a sleeping mode in which a minimum number of processes are carried out by a dark current supplied from the battery 13 when the ignition switch is in an off state. The microcomputer 23 wakes up to become in a normal active mode when the ignition switch is turned on.

Next, some general discussions will be made about a charging efficiency of the battery 13 and a charging efficiency computing method during charging of the battery 13.

When the battery 13 is charged under a predetermined charging voltage $V_T$, the application of the predetermined charging voltage $V_T$ breaks an insulative passivating film which has been formed on poles of the battery 13 during a non-working period of the battery 13. The passivating film gradually decreases and diminishes under the predetermined charging voltage $V_T$.

As illustrated in FIG. 3, a charging current $I_{CHG}$ corresponding to the predetermined charging voltage $V_T$ does not flow simultaneously with the charging start of the battery 13. The charging current $I_{CHG}$ increases toward the value corresponding to the predetermined charging voltage $V_T$ with the passivating film being broken so that the poles of the battery becomes better in conductivity.

While the charging current $I_{CHG}$ of the battery 13 is increasing toward the value corresponding to the predetermined charging voltage $V_T$, the charging current $I_{CHG}$ is at a lower level so that no decrease of the charging efficiency due to a gas generated in the battery 13 occurs. Thus, the battery 13 is charged effectively in charging current until the charging current $I_{CHG}$ reaches the value corresponding to the predetermined charging voltage $V_T$.

In the meantime, after the charging current $I_{CHG}$ has reached the value corresponding to the predetermined charging voltage $V_T$, the passivating film has been completely broken so that there is no effect of the passivating film. Under the application of the predetermined charging voltage $V_T$, the charging current $I_{CHG}$ of the battery 13 is effected by an impedance increase related to a voltage increase $\Delta E_0$ of an inner electromotive voltage $E_0$ of the battery 13 and an inner resistance R+Rpol of the battery 13.

Until the charging current $I_{CHG}$ of the battery 13 reaches the maximum value corresponding to the predetermined charging voltage $V_T$ with the progress of breaking of the passivating film, the inner electromotive voltage $E_0$ increases by $\Delta E_0$ that is very small. Thus, the resistance of the battery 13 is substantially equal to the inner resistance R+Rpol of the battery 13.

In the meantime, when no passivating film is formed on the poles of the battery 13, the charging current $I_{CHG}$ corresponding to the predetermined charging voltage $V_T$ flows just after the charging start. Thus, the resistance of the battery 13 becomes substantially equal to the inner resistance R+Rpol of the battery 13 just after the charging start.

Thus, when no passivating film is formed on the poles of the battery 13, the charge of the battery 13 begins just after the application of the predetermined charging voltage $V_T$. When a passivating film is formed on the poles of the battery 13, the charge of the battery 13 begins after the passivating film has been completely broken by the application of the predetermined charging voltage $V_T$ so that the charging current $I_{CHG}$ of the battery 13 has reached the maximum value corresponding to the predetermined charging voltage $V_T$. Accordingly, as illustrated in FIG. 4, the battery 13 is replaced by a circuit having a pure resistance $R_O$, a polarization resistance $R_{pol0}$, and an electromotive voltage $E_0$ which are connected in series.

During the charge of the battery 13 under the application of the predetermined charging voltage $V_T$, the inner electromotive voltage $E_0$ increases by an increase $\Delta E_0$ so that $R_O+R_{pol0}$ decreases into $R'+R_{pol'}$ ($R'<R_O$, $R_{pol'}<R_{pol0}$).

It may be assumed that the increase $\Delta E_0$ is due to an impedance increase $R_{E0}$ in the battery. Thus, as illustrated in FIG. 5, the circuit equal to the battery 13 is changed to a circuit having an inner electromotive voltage $E_0$, an impedance increase $R_{E0}$, a pure resistance $R'$, and a polarization resistance $R_{pol'}$ which are connected in series.

If the charging efficiency is an ideal value of 100%, a total electrical quantity supplied into the battery 13 is completely used for charging the battery 13. In the equivalent circuit shown in FIG. 5, $\Delta E_0$ decreases a voltage drop due to the pure resistance and the polarization resistance.

Thus, the following equation is obtained concerning the battery inner resistance of the battery 13.

$$R_{E0}+R'+R_{pol'}=R_O+R_{pol0}$$

$$(R_{E0}+R'+R_{pol'}) \times I_{CHG}=(R_O+R_{pol0}) \times I_{CHG0}$$

At the start point of the charging of the battery 13, the battery inner resistance ($R_O+R_{pol0}$) is constant. Therefore, during the charging of the battery 13, the battery inner resistance ($R_{E0}+R'+R_{pol'}$) is also constant.

However, the charging efficiency of the battery 13 is not 100% actually. Because, the charging of the battery 13 generates oxygen and hydrogen gases which are changed into $H_2O$, so that an electrical quantity supplied to the battery 13 is not partially stored in the battery 13.

Due to the gas generation, the battery inner resistance of the battery 13 is increased by $R_{GAS}$ corresponding to the gas generation. That is, the battery inner resistance becomes $R_{E0}+R'+R_{pol'}+R_{GAS}$.

Figure 6:
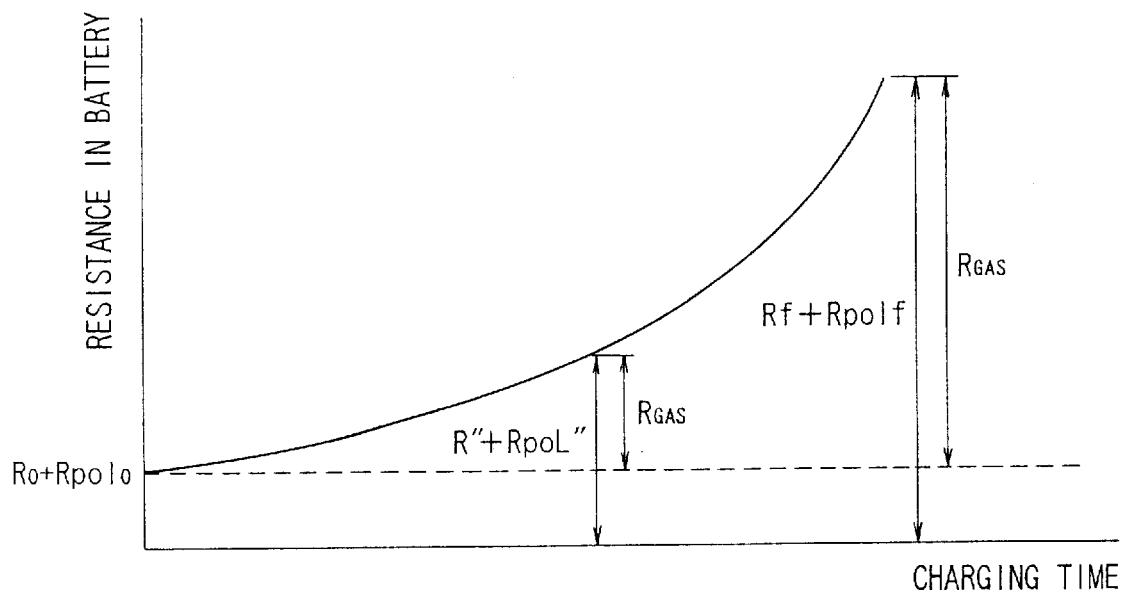
FIG. 6 is a graph showing a discharging current varying with time in respect of the battery of which a charged electrical quantity is computed by a charged electrical quantity computing unit of FIG. 2.
Figure 9:
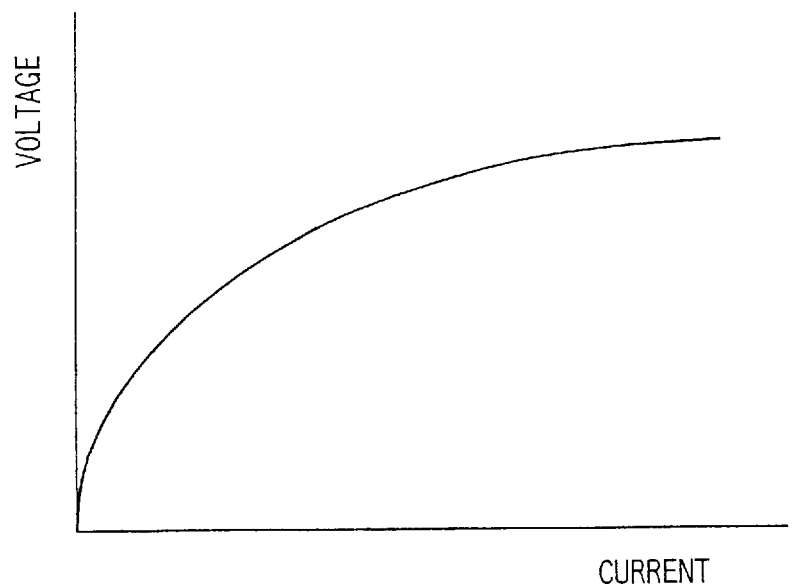
FIG. 9 is a graph showing an example of polarization (voltage) varying with current of a battery.

Furthermore, the gas generation increases while the charging of the battery 13 advances toward its full charged state, so that the gas resistance $R_{GAS}$ varies with the charged state of the battery 13. FIG. 6 shows the inner resistance of the battery 13 which varies with a charging time during a constant voltage charging of the battery 13. The battery inner resistance of the battery 13 increases by $R_{GAS}$ from $R_O+R_{pol0}$ that is a resistance value at the charging start until the battery 13 reaches its full charged state.

Thus, in the constant voltage charging of the battery 13 under the predetermined charging voltage $V_T$, the battery inner resistance (R"+Rpol") increases from $R_O+R_{pol0}$ which is a resistance value at the charging start until the battery 13.

Therefore, the current $I_{CHG}$ flown into the battery 13 (called as $I_{CHG(measured)}$ herein) is larger than the $I_{CHG}$ used for charging the battery 13 (called as $I_{CHG(effective)}$ herein). The difference between $I_{CHG(measured)}$ and $I_{CHG(effective)}$ is indicated by $I_{GAS}$ corresponding to the aforementioned gas generation of the battery 13 as shown by the following equation.

$$I_{CHG(measured)}=I_{CHG(effective)}+I_{GAS}$$

The charging efficiency of the battery 13 is obtained by the following equation.

$$\text{Charging Efficiency}=(I_{CHG(effective)}/I_{CHG(measured)})\times 100\%$$

The $I_{CHG(measured)}$ can be obtained from an output of the current sensor 15. However, $I_{CHG(effective)}$ can not be measured actually, so that $I_{GAS}$ can not be obtained also. Therefore, another factor which can be measured is required for obtaining $I_{GAS}$.

The larger the $R_{GAS}$ becomes the smaller the $I_{CHG(effective)}$ becomes. When the battery 13 reaches its full charged state where the $R_{GAS}$ becomes the maximum, almost all of the $I_{CHG}$ is used for the gas generation, so that the battery 13 is no longer charged.

That is, in the full charged state, an electrical power supplied to the battery 13 is used for the gas generation, so that the charging efficiency is zero.

At any point during the charging of the battery 13, $R_{GAS}$ represents a value which is not charged in the battery 13. Thus, the ratio of $R_{GAS}$ to $R_{GAS}f$ that is $R_{GAS}$ at the full charged point relates a drop of the charging efficiency of the battery 13.

When the charging efficiency is 100%, the battery inner resistance ($R_{E0}+R'+R_{pol'}$) is equal to the value ($R_O+R_{pol0}$) at the charging start.

The battery inner resistance of the battery 13 at any point during the charging of the battery 13 is indicated by $R"+R_{pol}"$. Thus, the following equation is obtained.

$$R_{GAS"}=(R"+R_{pol"})-(R_O+R_{pol0})$$

At the full charged point of the battery 13, the battery inner resistance ($R_{E0}+R'+R_{pol'}$) is negligibly smaller than $R_{GAS}$. That is:

$$R_{GAS}>>R_{E0}+R'+R_{pol'}$$

In the meantime, at the full charged state of the battery 13, the battery inner resistance (Rf+Rpolf) is equal to the aforementioned formula ($R_{E0}+R'+R_{pol'+RGAS}$).

$$Rf+Rpolf=R_{E0}+R'+R_{pol'}+R_{GAS}$$

Thus, at the full charged state of the battery 13:

$$R_{GAS}>>R_{E0}+R'+R_{pol'}, \text{ and}$$

$$Rf+R_{polf}=R_{E0}+R'+R_{pol'}+R_{GAS}$$

Thus, the following formula is obtained.

$$Rf+R_{polf}\approx R_{GAS}$$

This shows that the full charged state resistance (Rf+$R_{polf}$) is replaced by $R_{GAS}f$.

Therefore, $R_{GAS}"/R_{GAS}f$ is obtained as follows:

$$[(R"+Rpol")-(R_O+R_{pol0})]/(Rf+Rpolf)$$

Therefore, a charging drop ratio is obtained by the following formula.

$$[(R"+R_{pol}")-(R_O+R_{pol0})]/(Rf+R_{polf})$$

The charging drop ratio is deducted from 1 (one) to obtain the charging efficiency of the battery 13. That is, the charging efficiency (%) of the battery 13 at any point during the charging is obtained by:

$$\{1-[[(R"+R_{pol}")-(R_O+R_{pol0})]/(Rf+R_{polf})]\}\times 100\%$$

The charging efficiency and the charging efficiency computing method of the battery 13 have been discussed as mentioned above.

Next, a method for obtaining the battery inner resistance ($R+R_{pol}$) of the battery 13 will be discussed. The battery inner resistance is necessary for obtaining the charging efficiency of the battery 13. R designates a pure resistance and $R_{pol}$ designates a polarization resistance of the battery 13.

When no passivating film is formed on poles of the battery 13, the following equation is provided concerning the predetermined charging voltage $V_T$, an inner electromotive force E, an inner resistance ($R+R_{pol}$), and a charged electrical quantity.

$$V_T-E=(R+R_{pol})\times I_{CHG}$$

Thus, the inner resistance ($R+R_{pol}$) of the battery 13 is obtained as follows:

$$(R+R_{pol})=(V_T-E)/I_{CHG}$$

Next, how to obtain a battery electromotive force E of the battery 13 before the charging start will be discussed. The E is necessary for obtaining a battery inner resistance ($R+R_{pol}$).

The battery electromotive force E of the battery 13 before the charging start is equal to an open circuit voltage OCV at this stage.

Therefore, a process for obtaining the battery electromotive force E of the battery 13 before the charging start will be discussed hereinafter.

First, during the discharging of the battery 13, a discharging current I and a terminal voltage V of the battery 13 are periodically measured by the current sensor 15 and the voltage sensor 17. Outputs from the current sensor 15 and the voltage sensor 17 are stored after an A/D conversion process through the I/F 21. The measured data is used for calculating a pure resistance R and a voltage-current characteristic related to the pure resistance R of the battery 13 with no effect of polarization of the battery 13.

Furthermore, a voltage-current characteristic including an effect of polarization of the battery 13 is calculated from data of a terminal voltage V and a discharging current I which are measured during the discharging, particularly during a current decreasing period of the discharging of the battery 13.

Then, an estimated voltage Vn that is an open circuit voltage of the battery 13 is calculated from the V-I characteristic not including a polarization effect and the V-I characteristic including a polarization effect of the battery 13.

First, a general characteristic of the battery will be discussed hereinafter.

Figure 7:
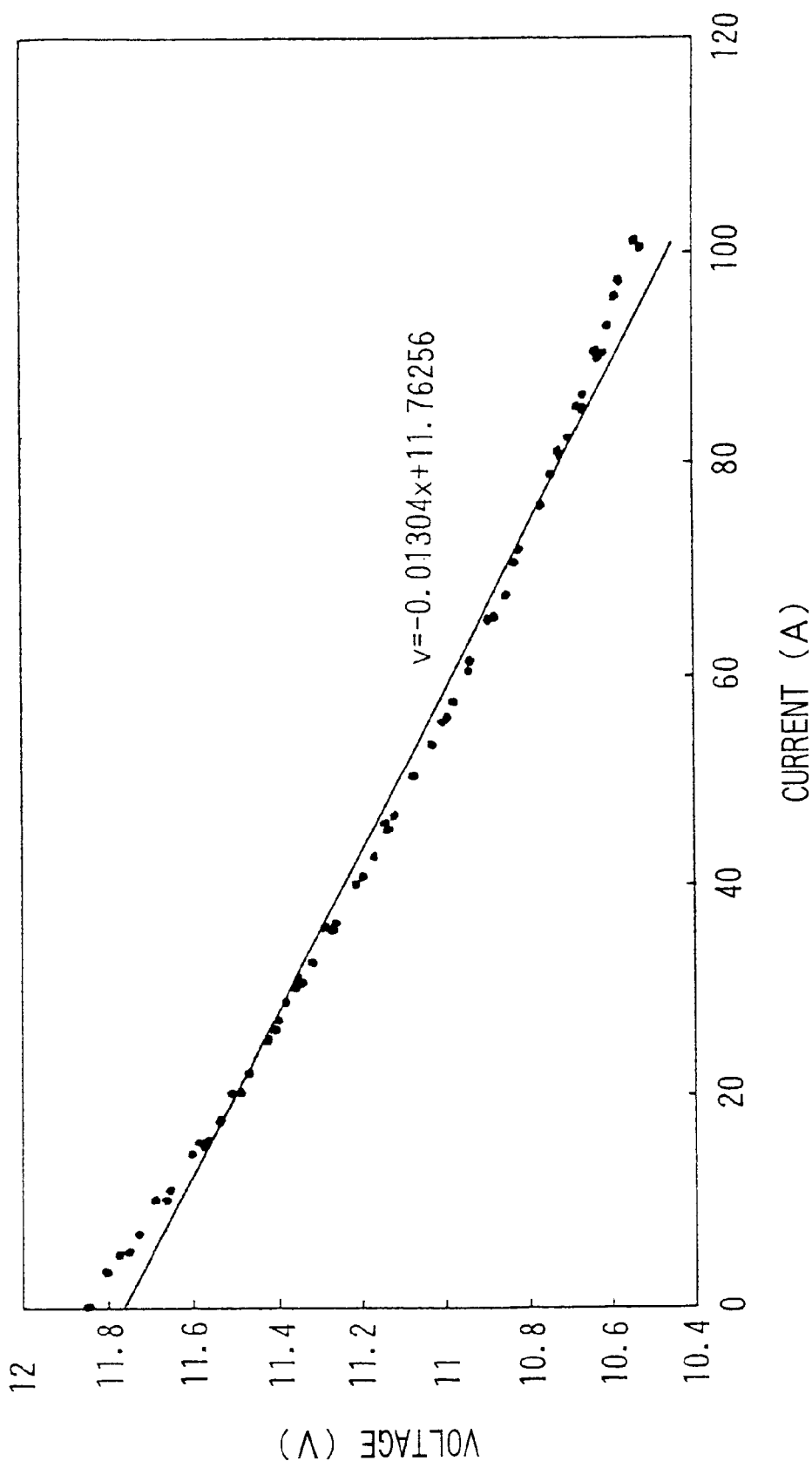
FIG. 7 is a graph showing an example of a voltage-current characteristic, which is expressed by an approximate linear equation.
Figure 8:
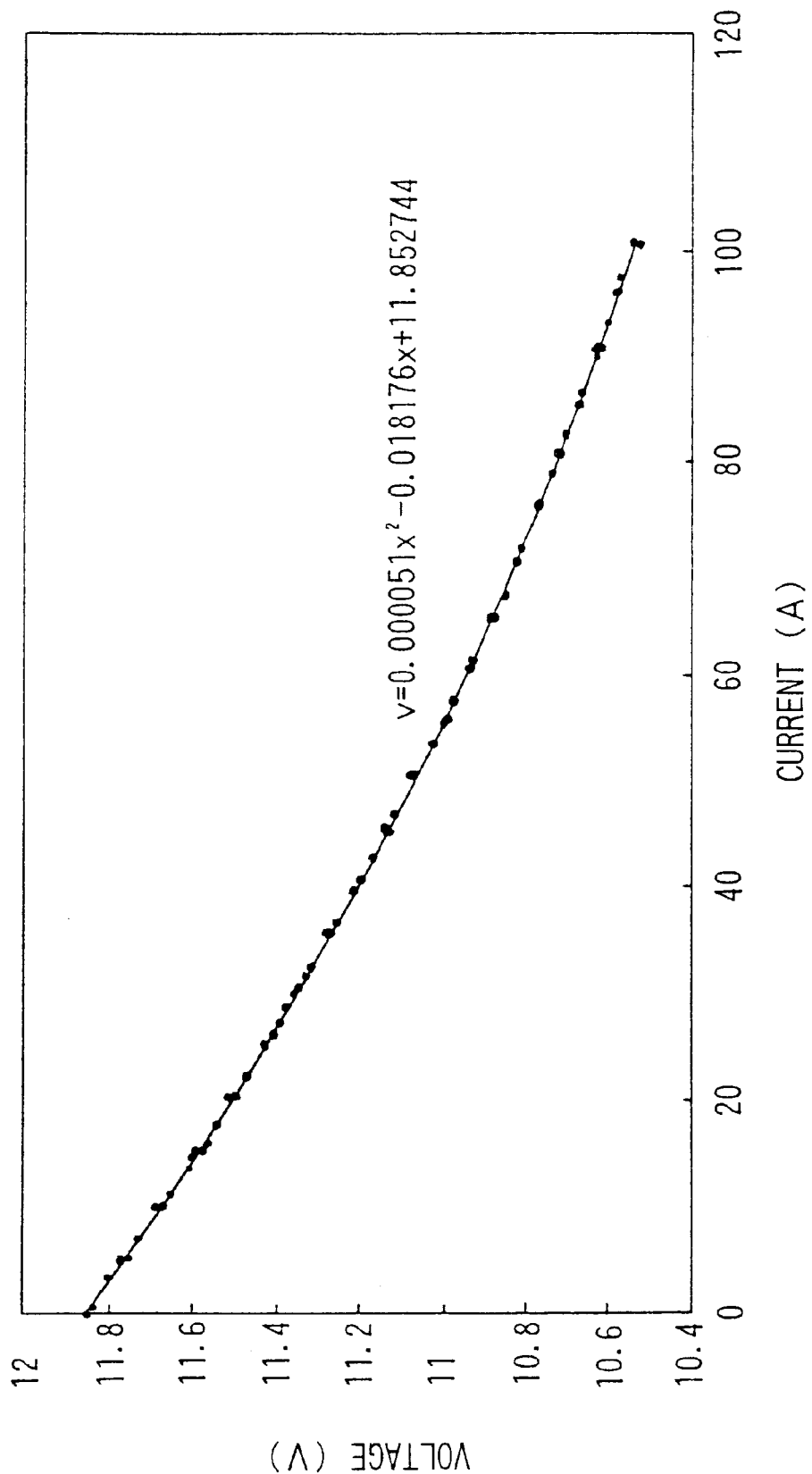
FIG. 8 is a graph showing an example of a voltage-current characteristic, which is expressed by an approximate quadratic equation.

A 12 V car, a 42 V car, an electric car, or a hybrid car incorporates a load which requires a large current, such as a starter motor, a motor generator, a running motor, etc., and examples of the voltage-current (V-I) characteristic of a battery for supplying the electric power to these loads are shown in FIGS. 7 and 8.

The V-I characteristic of the battery can be approximated by a linear equation: $V = aI + b$. However, in this embodiment, considering the influence of the characteristic of non-linearity of the polarization component as shown in FIG. 8, a quadratic approximate equation with high correlation: $V = aI^2 + bI + c$ is used. This equation can be obtained by a least-squares method.

Figure 10:
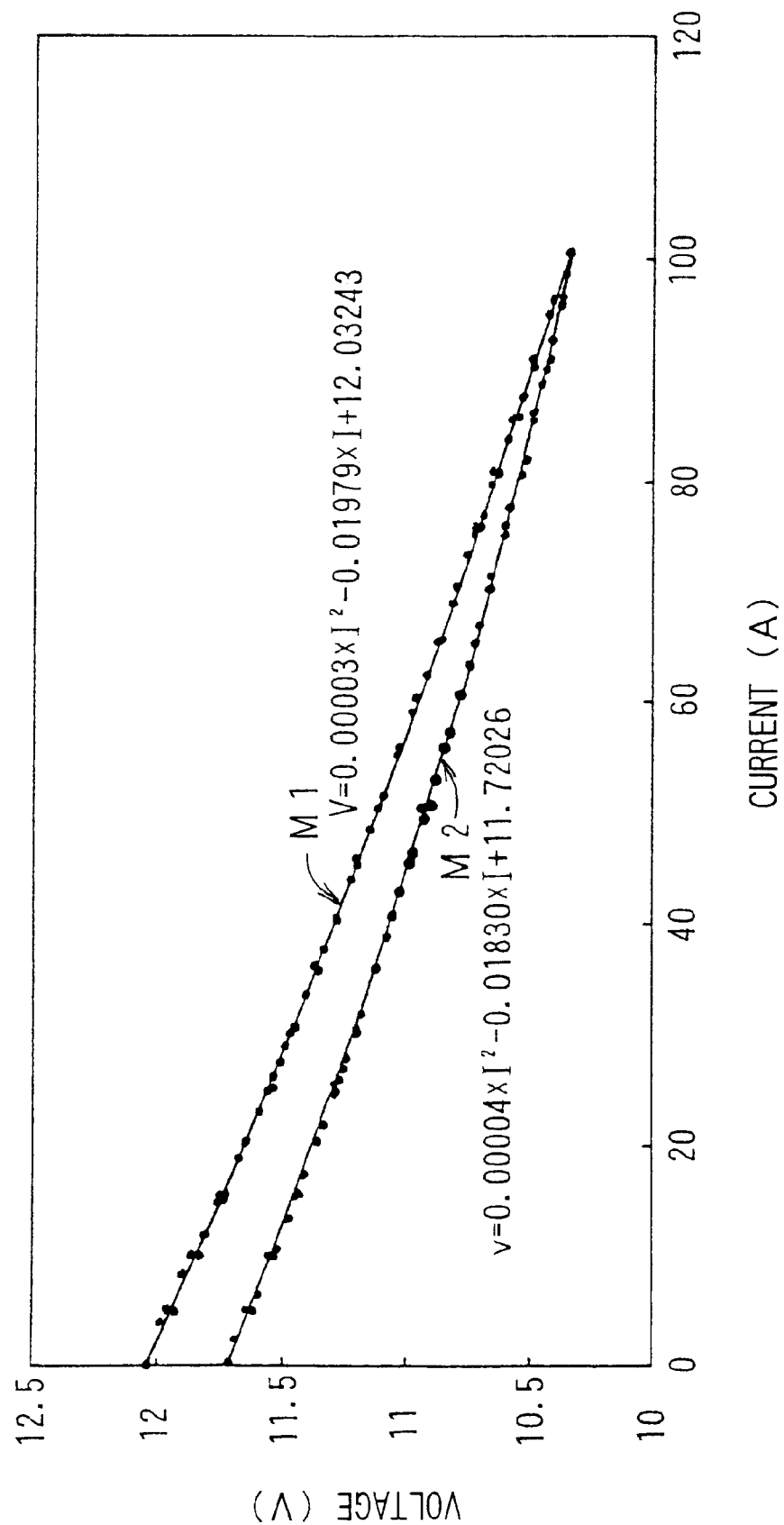
FIG. 10 is a graph showing examples of the approximate characteristic curves represented by two quadratic approximate equations, which are obtained during a discharging pattern of the battery.

While the load which requires a large current is driven, a discharging current flowing when the battery is discharged once increases monotonously to exceed a prescribed value and decreases monotonously from the maximum value to the prescribed value or lower. The discharging current and the terminal voltage of the battery at this time are measured periodically to acquire the real data indicative of the correlation between the terminal voltage and discharging current. On the basis of the data, as shown from the graph of FIG. 10, characteristic curves (hereinafter also referred to as approximate curves) are represented by two approximate equations M1 and M2. The first approximate equation M1 represents the V-I characteristic for an increasing discharging current which increases, after the discharging has been started, to reach a maximum value and the V-I characteristic for a decreasing current which decreases from the maximum value. The equation described in FIG. 10 is an example of a concrete approximate equation obtained by the real data. The difference between these two approximate equations M1 and M2 will be analyzed.

In the case of the first approximate equation M1, using, as a standard, the polarization resistance component at the start of discharging, when the current increases after the discharging has been started, the polarization resistance component increases gradually. When the current reaches the maximum value, the polarization resistance component reaches the peak. Thereafter, the polarization is gradually dissolved with a decrease in the current. However, actually, the polarization resistance component is not dissolved in proportion to a decrease in the current, but the reaction is delayed. Therefore, in the approximate equation M2, the same V-I characteristic as when the current increases is not exhibited, but a larger voltage drop is generated. Thus, two approximate equations M1 and M2 corresponding to when the voltage increases and when it decreases are acquired.

Now referring to FIGS. 11 to 13, an explanation will be given of the method of measuring the pure resistance of a battery using two approximate curve equations M1 and M2 of the above V-I characteristic.

First, a point A is set within a range of the real data on the approximate curve represented by M1. A voltage drop $\Delta V1$ from intercept C1 of the approximate curve M1 for the ordinate of the graph of FIG. 11 to point A is acquired. The value when the $\Delta V1$ is divided by the current I1 at point A is a combined resistance that is a sum of the pure resistance R and the polarization resistance component $R_{pol}1$. Namely, $$R + R_{pol}1 = \Delta V1/I1$$

Figure 11:
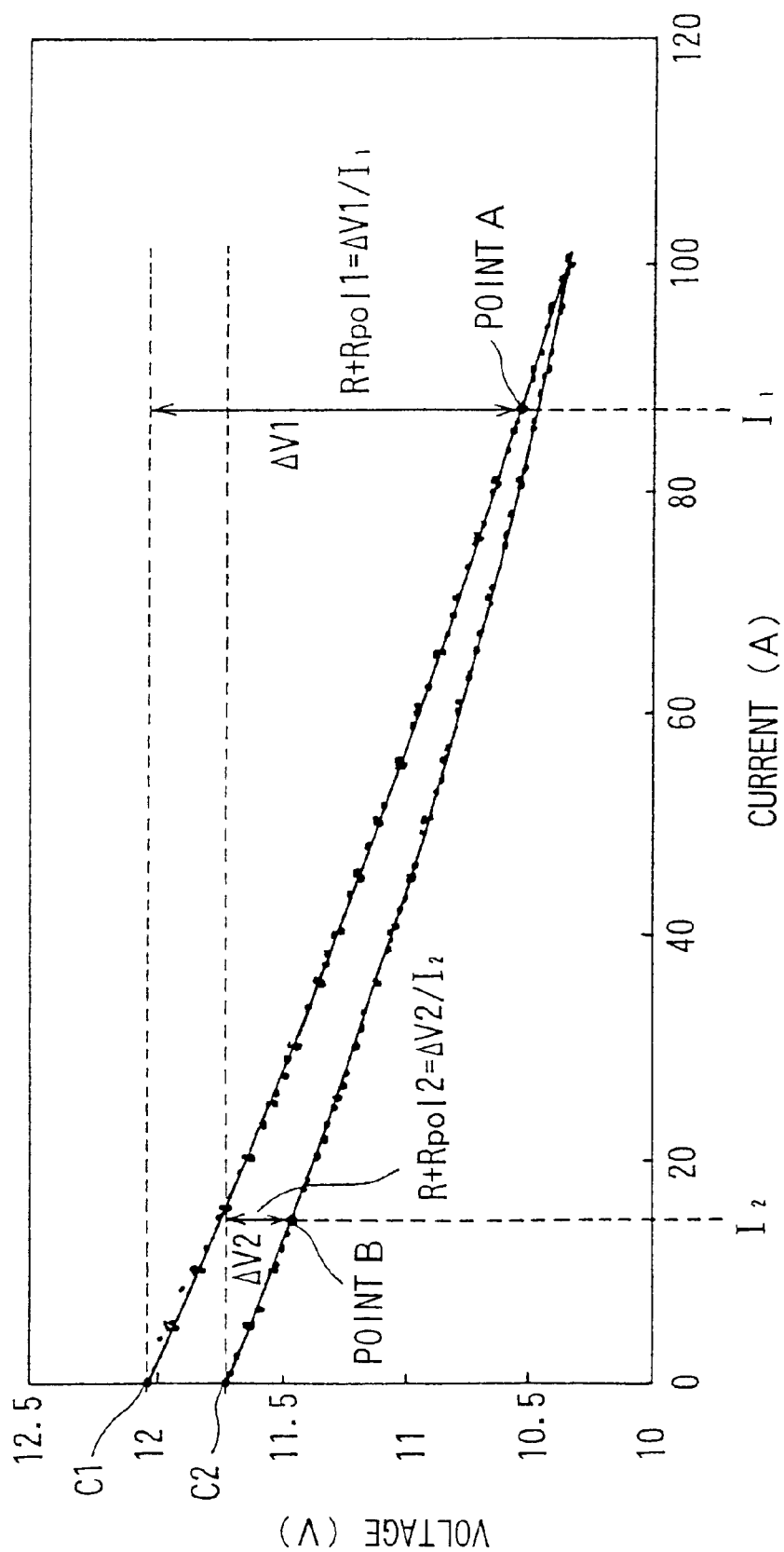
FIG. 11 is a graph for explaining the method for defining two optional points on the two approximate characteristic curves.

Likewise, as seen from the graph of FIG. 11, point B is set within a range of the real data on the approximate curve represented by M2. A voltage drop $\Delta V1$ from intercept C2 of the approximate curve M2 for the ordinate of the graph of FIG. 11 is acquired. The value when the $\Delta V2$ is divided by the current I2 at point B is a combined resistance that is a sum of the pure resistance R and the polarization resistance component $R_{pol}2$. Namely, $$R + R_{pol}2 = \Delta V2/I2$$

The difference $\Delta R$ between the combined resistances at points A and B is represented by $$\Delta R = R + R_{pol}1 - (R + R_{pol}2) = R_{pol}1 - R_{pol}2$$

This value represents a difference in the polarization resistance at points A and B. Therefore, it is apparent that the pure resistance R during the discharging does not vary.

Figure 12:
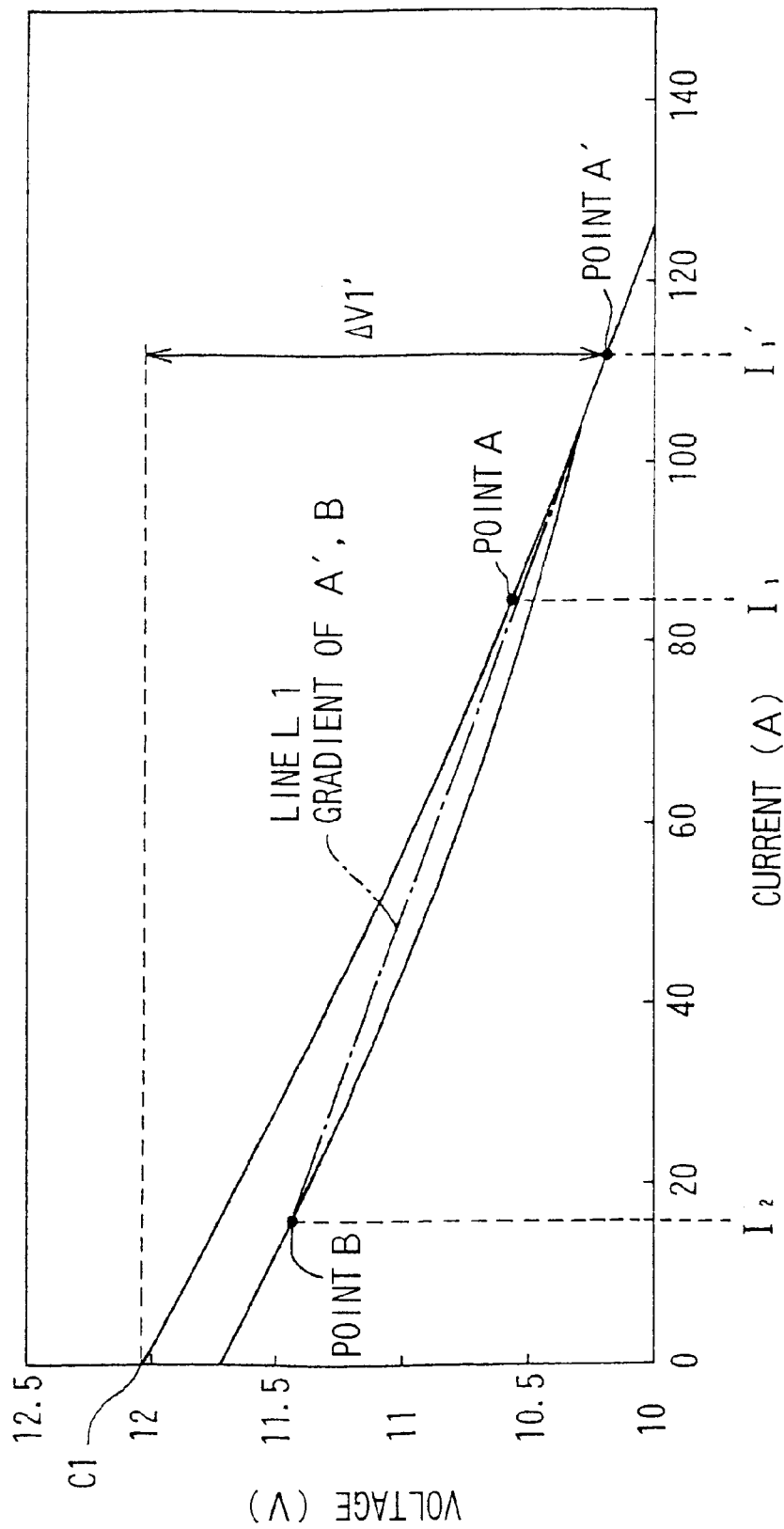
FIG. 12 is a graph for explaining the manner for defining an assumed point on one of the approximate characteristic curve and the manner for correcting the gradient between two points.

Incidentally, as shown in FIG. 12, point A' with a value $(R + R_{pol}1')$ equal to the combined resistance $(R + R_{pol}2)$ at point B selected on the approximate curve M2 is located on the approximate curve M1. Further, as shown in FIG. 13, point B' with a value $(R + R_{pol}2')$ equal to the combined resistance at point A selected on the approximate curve M1 is located on the approximate curve M2. Namely, point A' where $R + R_{pol}1' = R + R_{pol}2$ is located on the approximate curve M1, whereas point B' where $R + R_{pol}1 = R + R_{pol}2'$ is located on the approximate curve M2.

In short, assuming that the current and voltage at point A' are I1' and V1', and that the current and voltage at point B' are I2' and V2', the polarization resistances at point A' of the coordinates (I', V1') and at point B of the coordinates (I2, V2) are equal to each other, and the polarization resistances at point A of the coordinates (I1, V1) and at point B' of the coordinates (I2', V2') are equal to each other.

An explanation will be given of the manner of computing the current I1' and voltage V1' at point A' with the resistance equal to the combined resistance $(R + R_{pol}2)$ at point B which is used as a standard.

The voltage drop $\Delta V1'$ from intercept C1 of the approximate curve M1 for the ordinate to point A' can be expressed by $$\Delta V1' = C1 - (a1I1'^2 + b1I1' + C1) = (R + R_{pol}2)I1'$$

Therefore, $$-(a1I1' + b1) = R + R_{pol}2$$

Thus, the current I1' at point A' is expressed by $$I1' = -(b1 + R + R_{pol}2)/a1$$

Since $R + R_{pol}2(= R' + R_{pol}1') = \Delta V2/I2 (= \Delta V1'/I1')$, $$I1' = -[b1 + (\Delta V2/I2)]/a1$$

$$= -[b1 + (\Delta V1'/I1')]/a1$$

As apparent from the above equation, the voltage V1' at point A' is expressed by $$V1'=a1I1'^2+b1I1'+C1$$

Thus, the coordinates (I1'+V1') of point A' is computed by known values.

Likewise, the current I2' and voltage V2' at point B' equal to that (R+$R_{pol}$1) at point A are expressed by $$I2'=-[b2+(\Delta V2/I2)]/a2$$
$$=-[b2+(\Delta V1'/I1')]/a2$$
$$V2'=a2I2'^2+b2I2'+C2$$

Thus, the coordinates (I1', V2') can be computed by known values.

$\Delta V2'$ represents the voltage drop from intercept C2 of approximate curve M2 for the ordinate crosses the ordinate.

Thereafter, as seen from FIG. 12, the gradient of a line L1 connecting point A' of the coordinates (I1', V1') of and point B of the coordinates (I2, V2) is acquired to provide the combined resistance R1. The combined resistance R1 is acquired by dividing the voltage drop (V1'-V2) due to the combined resistance (composed of the pure resistance and the polarization resistance $R_{pol}$2) by current difference (I1'-I2). Namely, $$R1=(V1'-V2)/(I1'-I2)$$

Figure 13:
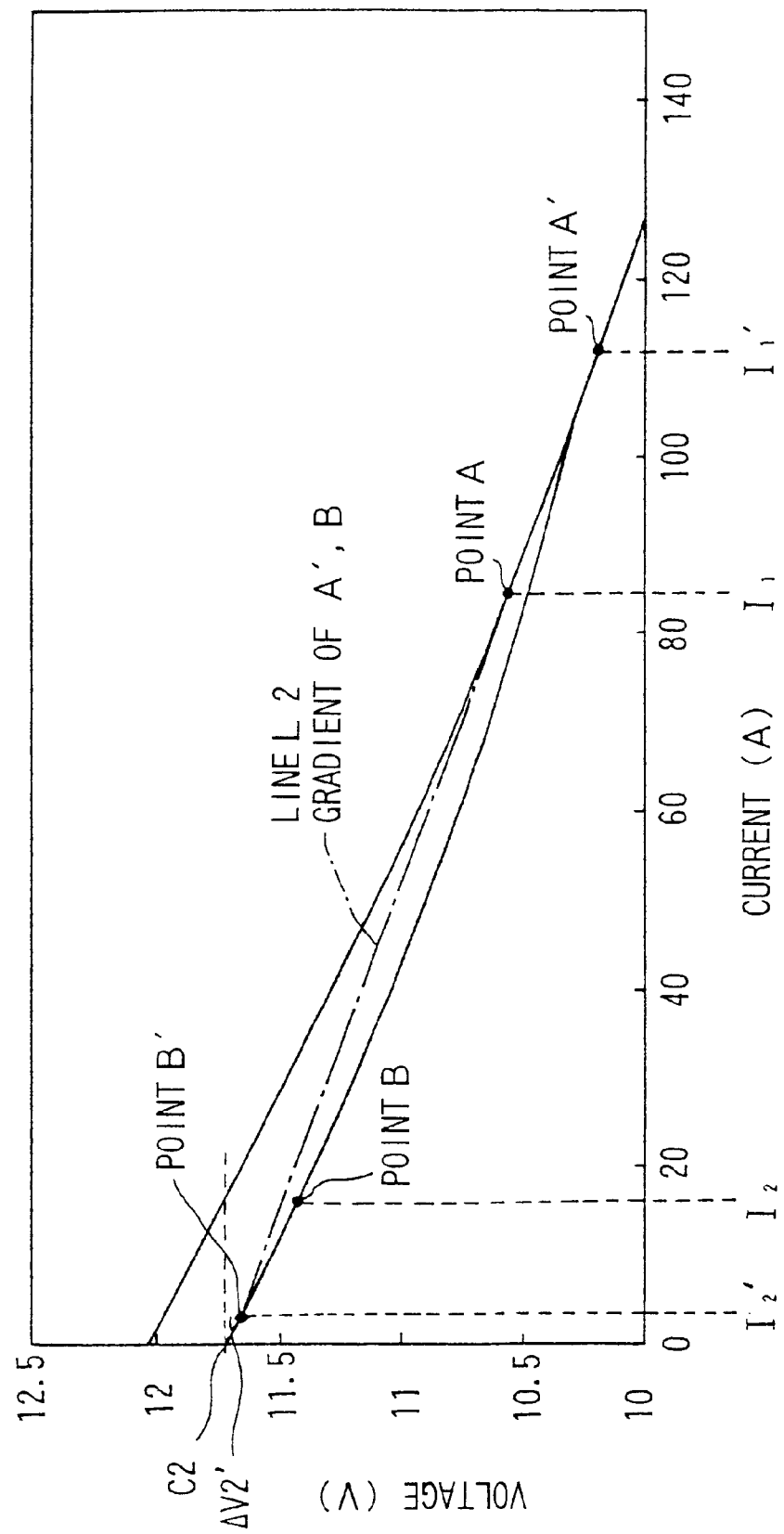
FIG. 13 is a graph for explaining the manner for defining an assumed point for the other approximate characteristic curve and the manner for correcting the gradient between two points.

Likewise, as seen from FIG. 13, the gradient of a line L2 connecting point B' of the coordinates (I2', V2') and point A of the coordinates (I1, V1) is acquired to provide the combined resistance R1. The combined resistance R2 is acquired by dividing the voltage drop (V1'-V2) due to the combined resistance (composed of the pure resistance and the polarization resistance $R_{pol}$1) by current difference (I1-I2'). Namely, $$R2=(V1-V2')/(I1-I2')$$

However, the combined resistances R1 and R2 are not coincident to pure resistances. This inconvenience can be overcome by dividing the voltage drop exclusive of that due to the polarization resistance.

With reference to point B, assuming that the combined resistance R1 is expressed by $$R1=R1'+R_{pol}2=R1'+R_{pol}1',$$

the voltage drop produced when the current corresponding to a difference between the current I1' at point A' and the I2 at point B flows through the resistance R1' should be incrementally compensated for, at the voltage at point A', by the voltage drop produced when a current corresponding to a difference between the current I1' at point A' and the current I2 at point B flows through the polarization resistance $R_{pol}$1' (or $R_{pol}$2), and hence the following equation holds.

$$R1'(I1'-I2)=[V1'+R_{pol}1'(I1'-I2)]-V2$$

Hence, $$R1'(I1'-I2)=(V1'-V2)+R_{pol}1'(I1'-I2)$$

Now, since $R_{pol}1'=\Delta V1'/I1'-R1'$ $$R1'(I1'-I2)=(V1'-V2)+(\Delta V1'/I1'-R1')(I1'-I2)$$
$$2R1'(I1'-I2)=(V1'-V2)+\Delta V1'/I1'(I1'-I2)$$

As a result, $$R1'=[(V1'-V2)+(\Delta V1'/I1')(I1'-I2)]/2(I1'-I2)$$

Incidentally, it should be noted that ($\Delta V1'/I1'$) can be replaced by ($\Delta V2/I2$).

Likewise, with reference to point A, assuming that the combined resistance R2 is expressed by $$R2=R2'+R_{pol}1=R2'+R_{pol}2',$$

the voltage drop produced when the current corresponding to a difference between the current I1 at point A and the I2' at point B' flows through the resistance R2' should be detrimentally compensated for, at the voltage at point B', by the voltage drop produced when a current corresponding to a difference between the current I1 at point A and the current I2' at point B' flows through the polarization resistance $R_{pol}$2' (or $R_{pol}$1), and hence the following equation holds.

$$R2'(I1-I2')=V1-[V2'-R_{pol}2'(I1-I2')]$$

Hence, $$R2'(I1-I2')=(V1-V2')+R_{pol}2'(I1-I2')$$

Now, since $R_{pol}2'=\Delta V2'/I2'-R2'$ $$R2'(I1-I2')=(V1-V2')+(\Delta V2'/I2'-R2')(I1-I2)$$
$$2R2'(I1-I2')=(V1-V2')+\Delta V12/I2'(I1'-I2')$$

As a result, $$R2'=[(V1-V2')+(\Delta V2'/I2')(I1-I2')]/2(I1-I2')$$

Incidentally, it should be noted that ($\Delta V2'/I2'$) can be replaced by ($\Delta V1/I1$).

The two resistances R1' and R2' have been acquired with reference to the two points A and B using the different polarization resistances ($R_{pol}1'=R_{pol}2$) and ($R_{pol}1=R_{pol}2'$) and voltage drops $\Delta V1'(\Delta V1)$ and $\Delta V2'(\Delta V2)$ from the different intercepts C1 and C2, and hence cannot be pure resistances. Thus, by obtaining the weighted average of both resistances, $$R=(R1'+R2')/2$$

the real pure resistance R can be acquired.

The newer sets of the terminal voltages and the discharging currents for a prescribed time are stored for collection in a memory such as a RAM serving as a rewritable storage means. Using the sets of terminal voltages and the discharging currents thus collected, two approximate curves M1 and M2 which show the relationship between the terminal voltage and the discharging current are obtained by the least squares method. They are the first approximate curve M1 which shows a change of the voltage for an increasing discharging current, represented by a quadratic equation: $V1(I)=a1I^2+b1I+C1$ and the second approximate curve M2 which shows a change of the voltage for a decreasing discharging current, represented by a quadratic equation: $V2(I)=a2I^2+b2I+C2$.

The first point A and the second point B are set on the first approximate curve M1 and the second approximate curve M2, respectively. In this case, points A and B are preferably set within a range where real data of the terminal voltage and the discharging current used to acquire the approximate curves reside. In this way, the corresponding points will not be assumed at points largely separate from the set points. The first point A and the second point B are preferably set on both sides of point which provides a maximum point with maximum polarization resistance. Thus, the assumed points are set on both sides of the maximum point so that the accuracy of the pure resistance acquired later can be enhanced.

The first assumed point A' is assumed on the first approximate curve M1, and the second assumed B' is assumed on the second approximate curve M2. As described previously, the first assumed point A' provides the same resistance as the second combined resistance R2 composed of the pure resistance of the battery and the second polarization resistance component $R_{pol}2$, which produces the second voltage drop $\Delta V2$ when the second discharging current I2 corresponding to the second point B flows. The second assumed point B' provides the same resistance as the first combined resistance R1 composed of the pure resistance of the battery and the first polarization resistance component $R_{pol}1$, which produces the first voltage drop $\Delta V1$ when the first discharging current I1 corresponding to the first point A flows.

When the two assumed points A' and B' could be assumed appropriately, the first gradient R1 of the line L1 connecting the second point B and the first assumed point A' is corrected by the voltage drop $R_{pol}2$ (I1'−I2) due to the second polarization resistance component $R_{pol}2$, which are produced by the second discharging current I2 and the discharging current I1' at the first assumed point A', thereby providing the first corrected gradient R1' exclusive of the voltage drop due to the second polarization resistance component $R_{pol}2$. Likewise, the second gradient R2 of the line L2 connecting the first point A and the second assumed point B' is corrected by the voltage drop $R_{pol}2$ (I1−I2') due to the first polarization resistance component $R_{pol}2$, which are produced by the first discharging current I1 and the discharging current I2' at the second assumed point B', thereby providing the second corrected gradient R2' exclusive of the voltage drop due to the first polarization resistance component $R_{pol}1$.

The first corrected gradient R1' and the second corrected gradient R2 are summed and the sum is averaged to provide an average gradient. The average gradient thus provided is measured as a pure resistance of the battery.

Thus obtained pure resistance R of the battery 13 is multiplied by a discharging current I which is the latest measured one to obtain a terminal voltage V due to the pure resistance. Such a voltage V is obtained for a discharging current I at each measuring point. The plurality sets of V and I provide a linear equation $V_R = a_R I + b_R$ via a least square method. The equation is only related to the pure resistance with no effect of polarization of the battery 13.

Next, within a decreasing range of the discharging current I of the battery 13, a plurality of sets of actually measured V and I are used to obtain a linear equation V=aI+b via a least square method. The obtained equation includes effects of polarization of the battery 13.

Then, on the line $V_R = a_R I + b_R$ which includes no effects of the polarization, a measured set of coordinates $(V_1, I_1)$ is selected. Furthermore, the line V=aI+b which includes effects of the polarization is shifted parallel so as to pass the point $(V_1, I_1)$. Thereby, a shifted line V'=aI+b' is obtained.

From the equation V'=aI+b', an estimated voltage Vn is obtained. The estimated voltage Vn is added to a predetermined remaining voltage drop $e_0$ to obtain a corrected voltage Vn'.

The corrected voltage Vn' is equal to an open circuit voltage OCV before the charging of the battery 13.

An open circuit voltage OCV before the charging of the battery 13 can be obtained by another method. For example, a discharging current of the battery 13 is periodically measured to integrate the discharging current with time for obtaining a charged electrical quantity in the battery 13. The charged electrical quantity is compared with a reference table stored in ROM 23c so that an open circuit voltage OCV can be acquired.

Next, referring to FIGS. 14 and 15, a process executed by CPU 23a according to a control program stored in the ROM 23c will be discussed.

The microcomputer 23 starts when an electrical power is supplied from the battery 13. As illustrated in FIG. 14, CPU 23a determines whether the battery 13 is in its discharging state (step S1), for example, by confirming that the battery 13 is connected to a discharging circuit (not shown).

When the battery 13 is not in a discharging state (N in step S1), the processing goes to step S5 discussed later. When the battery 13 is in a discharging state (Y in step S1), a process for calculating an open circuit voltage OCV before the charging is carried out (step S2). The calculated open circuit voltage OCV of the battery 13 before charging is stored as a battery electromotive force E of the battery 13 in RAM 23b (step S3), and step S4 determines again whether the battery 13 is in a discharging state.

When the battery 13 is in a discharging state (Y in step S4), the execution returns to step S2. When the battery 13 is not in a discharging state (N in step S4), the execution returns to step S5.

When the battery is not in a discharging state in steps S1 and S4, the processing goes to steps including step S5, in which a charging efficiency and a charged electrical quantity of the battery 13 are obtained during a charging operation.

In step S5, outputs from the current sensor 15 and the voltage sensor 17 are supplied as A/D converted data through I/F 21. From digital values of voltages and currents, an electrical quantity charged in the battery 13 from the charging start to a present point is calculated (step S6).

The electrical quantity calculated in step S7 is added to the battery electromotive force E stored in RAM 23b (step S7) Outputs from the current sensor 15 and the voltage sensor 17 are supplied again as A/D converted data through I/F 21 (step S8). Step S9 determines whether the latest obtained current value is larger than a previous one. When the decision is negative (N in step S9), the execution goes to step S12 described later.

On the contrary, when the decision is affirmative (Y in step S9), an electrical quantity charged in the battery 13 during a period from a previous measuring point to a present measuring point is calculated by using outputs from the current sensor 15 and the voltage sensor 17 (step S10).

Then, the electrical quantity calculated in step S10 is added to the battery electromotive force E stored in RAM 23b (step S11) and the execution returns to step S8.

It is noted that a charging efficiency of 100% is assumed for calculating a charged electrical quantity in steps S6 and S10.

In step S9, when the latest output from the current sensor 15 is not larger than a previous one, the processing goes to step S12. In step S12, as illustrated in FIG. 15, a battery inner resistance $R_O + R_{pol0}$ of the battery 13 is obtained from a charging current $I_{CHG0}$, a predetermined charging voltage $V_T$, and an inner electromotive voltage E0 at the charging start as follows:

$$(R_O + R_{pol0}) = (V_T - E_0)/I_{CHG0}$$

Thus obtained battery inner resistance $R_O + R_{pol0}$ is stored in RAM 23b as a battery inner resistance (step S13) before the processing goes to step S14.

In step S14, a present charging current $I_{CHGA}$ and a present predetermined charging voltage $V_T$ are obtained from outputs of the current sensor 15 and the voltage sensor 17 after the charging start (step S14). The battery electromotive force E previously stored in RAM 23b is designated as E'. A battery inner resistance $R''+R_{pol''}$ after the charging start is obtained by the following equation (step S15).

$$(R''+R_{pol''})=(V_T-E'')/I_{CHGA}$$

Next, step S16 obtains a charging efficiency, which is a ratio of an electrical quantity charged in the battery 13 to a total electrical quantity flown into the battery 13, from the battery inner resistance $R''+R_{pol''}$ after the charging start, a full charged state resistance $Rf+R_{pol}f$, and the initial battery inner resistance $R_O+R_{pol0}$. The full charged state resistance $Rf+R_{pol}f$ has been preliminarily stored in ROM 23c. The charging efficiency is obtained by the following formula.

$$\{1-[[(R''+R_{pol''})-(R_O+R_{pol0})]/(Rf+R_{pol}f)]\}\times 100\%$$

Thus obtained charging efficiency of the battery 13 is multiplied by a present charging current $I_{CHGA}$ obtained in step S16 and the corresponding charging time. This provides an electrical quantity charged in the battery 13 from the previous sampling point to the present sampling point, and the electrical quantity is added to the battery electromotive force E which has been stored in RAM 23b (step S17). Then, step S18 determines whether the charging of the battery 13 is continuing.

Figure 14:
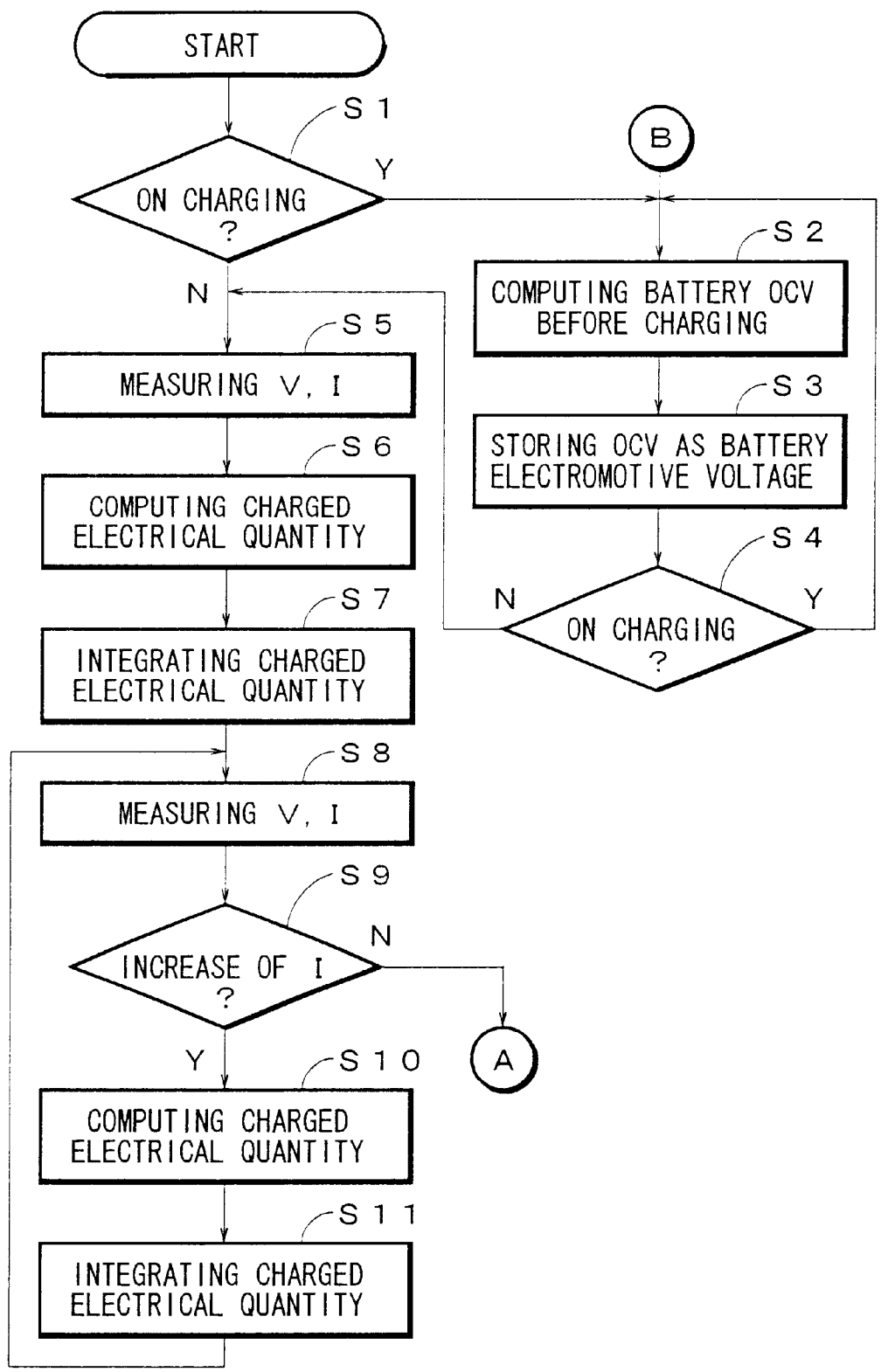

When the charging of the battery 13 is continuing (Y in step S18), the execution returns to step S14 of FIG. 14. When the charging of the battery 13 is not continuing (N in step S18) the execution returns to step S2 of FIG. 14.

As understood from the above discussion, in the battery charged electrical quantity computing unit 1 of the embodiment, step S12 of the flowchart of FIG. 15 is a process corresponding to the initial resistance computing device 23A described in the summary of the invention, and step S15 of FIG. 15 is a process corresponding to the on-charging resistance computing device 23B. Furthermore, step S16 is a process corresponding to the resistance difference computing device 23C and the resistance ratio computing device 23D.

Moreover, the measuring device A described in the summary of the invention corresponds to the current sensor 15, the voltage sensor 17, and a device for processing outputs from the current sensor 15 and the voltage sensor 17 which includes the A/D conversion and storing of the outputs during steps S2, S5, S8, and S14 of FIG. 14 or 15.

Furthermore, the active state computing means 23E described in the summary of the invention corresponds to step S9 of FIG. 14, and the transition period electrical quantity computing device 23F corresponds to step S10 of FIG. 14.

Next, operational steps of thus configured battery charged electrical quantity computing unit 1 of the embodiment will be discussed.

First, whether the battery 13 is in a charging state based on connection states of charging and discharging circuits with the battery 13 is determined. When it is determined that the battery 13 is in a discharging state, an open circuit voltage OCV corresponding to a voltage between a pair of terminals of the battery 13 which is in an equilibrium state before the start of charging is computed in consideration of measured terminal voltages V and discharge currents I of the battery during the discharging.

Thereafter, when the charging of the battery 13 starts after the discharging, a charging efficiency and a charged electrical quantity of the battery 13 are computed.

At a stage just after the charging, when the charging current $I_{CHG}$ is increasing, it is supposed that an insulative passivating film formed on poles of the battery is being gradually broken. Since the charging current is small at the stage, no gas generation occurs in the battery. Thus, an integration of the charging current $I_{CHG}$ multiplied by a corresponding charging time provides an electrical quantity stored in the battery 13 from the charging start, and the electrical quantity is added to the initial electromotive force E of the battery 13.

In the meantime, when the charging current $I_{CHG}$ is decreasing, it is supposed that there is no insulative passivating film on the poles of the battery 13, but there is a charging efficiency drop due to a gas generated in the battery. Therefore, a charging efficiency and a charging electric quantity of the battery are obtained generally after the charging current $I_{CHG}$ has reached the maximum value.

A battery inner resistance of the battery 13 is obtained as an initial resistance $(R_O+R_{pol0})$ at a point where the charging current $I_{CHG}$ is the maximum.

After the current maximum point, a present resistance $R''+R_{pol''}$ and a resistance difference $(R''+R_{pol''})-(R_O+R_{pol0})$ are periodically obtained until the charging of the battery 13 is completed.

Furthermore, a drop of the charging efficiency is obtained as a ratio of the resistance difference $(R''+R_{pol''})-(R_O+R_{pol0})$ to a full charged state resistance $Rf+R_{pol}f$. Thus, a charging efficiency at any point during the charging of the battery is obtained by $1-[[(R''+R_{pol''})-(R_O+R_{pol0})]/(Rf+R_{pol}f)]$.

After the charging completion of the battery 13, an integration of the charging current $I_{CHG}$, the charging efficiency, and the sampling interval time at each measuring point is an electrical quantity stored in the battery 13 during the sampling time. An integration of the electrical quantity from the start to the end of the battery charging provides a total electrical quantity charged in the battery 13.

While the breaking of a passivating film formed on the poles of the battery is being carried out just after the charging of the battery, a charged electrical quantity charged in the battery is calculated without consideration of the charging efficiency of the battery. After the breaking completion of the passivating film, a charged electrical quantity charged in the battery is calculated with consideration of the charging efficiency of the battery.

In the meantime, when the breaking of a passivating film formed on the poles of the battery is not carried out, or when no passivating film has not been formed on the poles of the battery before the charging start, the battery is in an active state from the beginning. In the active state, a charged electrical quantity charged in the battery is calculated with consideration of the charging efficiency of the battery as mentioned above.

In the battery charged electrical quantity computing unit 1 of the embodiment, an electrical quantity actually stored in the battery 13 and a charging efficiency necessary for computing a total charged electrical quantity are appropriately obtained from the terminal voltage $V_T$ and the charging current $I_{CHG}$.

It may be practically possible that a charged electrical quantity is summed after the charging current reached the maximum, when an electrical power supplied before the maximum point into the battery is negligibly small.

In the embodiment, for obtaining a pure resistance R and an open circuit voltage OCV of the battery 13, two the approximate curves M1 and M2 showing V-I characteristics are applied, and points A and B each on the approximate curve M1 or M2 are selected.

Now, referring to FIGS. 16 to 18, a second method for obtaining a pure resistance R and an open circuit voltage OCV of the battery 13 will be discussed hereinafter. The second method uses point P in place of points A and B. The point P is on the approximate curve M2 as well as on the approximate curves M1, and the discharging current is the maximum at point P.

Figure 16:
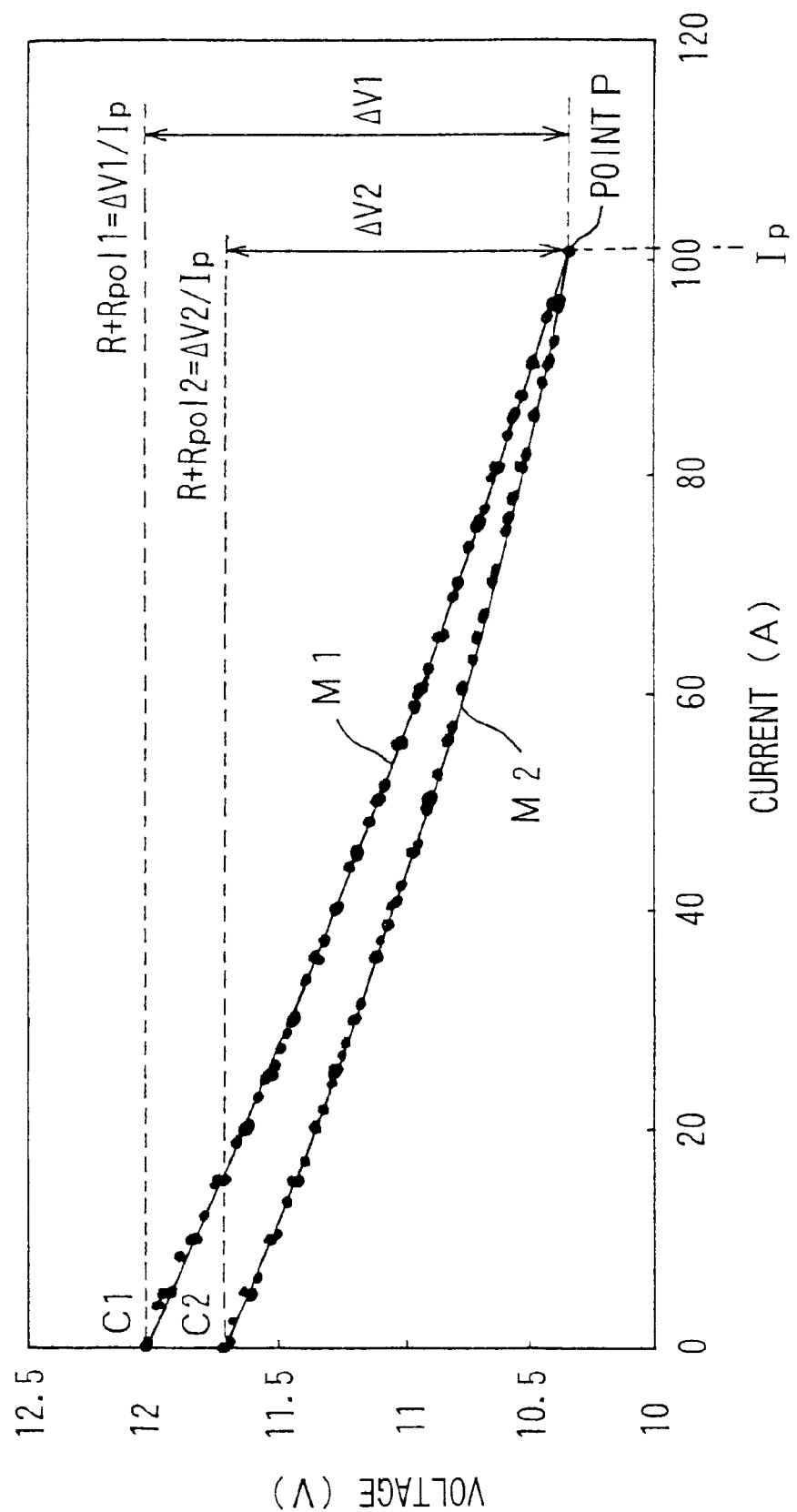
FIG. 16 is a graph for explaining the manner of defining two points on two approximate characteristic curves in a second process.

As illustrated in FIG. 16, point P common to the approximate curves M1 and M2 is selected. A vertical distance form intercept C1 of the approximate curve M1 to point P is a voltage drop $\Delta V1$. The voltage drop is caused by a pure resistance R and a polarization resistance $R_{pol}1$. That is:

$$R+R_{pol}1=\Delta V1/Ip$$

Ip: a current at point P

Next, as illustrated in FIG. 16, a vertical distance form intercept C2 of the M2 to point P is a voltage drop $\Delta V2$. The voltage drop is caused by a pure resistance R and a polarization resistance $R_{pol}12$. That is:

$$R+R_{pol}2=\Delta V2/Ip$$

In the embodiment described above, the two optional points A and B are set within the range where there are the real data of the approximate curves M1 and M2. However, as a modification thereof, a single point may be set at point P corresponding to the maximum discharging current of the battery, which is measured to acquire the two approximate curves M1 and M2. Using the common data, inclusion of an error can be suppressed. Referring to FIGS. 16 to 18, an explanation will be given of this modification.

First, a point P corresponding to the maximum value of the discharging current of the battery is set on the two approximate curves M1 and M2. A voltage drop $\Delta V1$ from the intercept C1 of the ordinate in the approximate curve M1 to point P on the approximate curves is acquired. The value obtained when the $\Delta V1$ is divided by the current Ip at point P is a combined resistance that is a sum of the pure resistance R and the polarization resistance component $R_{pol1}$. Namely, $$R+R_{pol}1=\Delta V1/Ip$$

Likewise, a voltage drop $\Delta V2$ from an intercept C2 of the ordinate of the approximate curve M2 to point P on the approximate curves is acquired. The value when the $\Delta V2$ is divided by the current Ip at point P is a combined resistance that is a sum of the pure resistance R and the polarization resistance component $R_{pol}2$. Namely, $$R+R_{pol}2=\Delta V2/Ip$$

The difference $\Delta R$ between the combined resistances at point P is represented by $$\Delta R=R+R_{pol}1-(R+R_{pol}2)=R_{pol}1-R_{pol}2$$

This value represents a difference in the polarization resistance at point P of the different approximate curves. Therefore, it is apparent that the pure resistance R when the discharging has occurred once does not vary.

Figure 17:
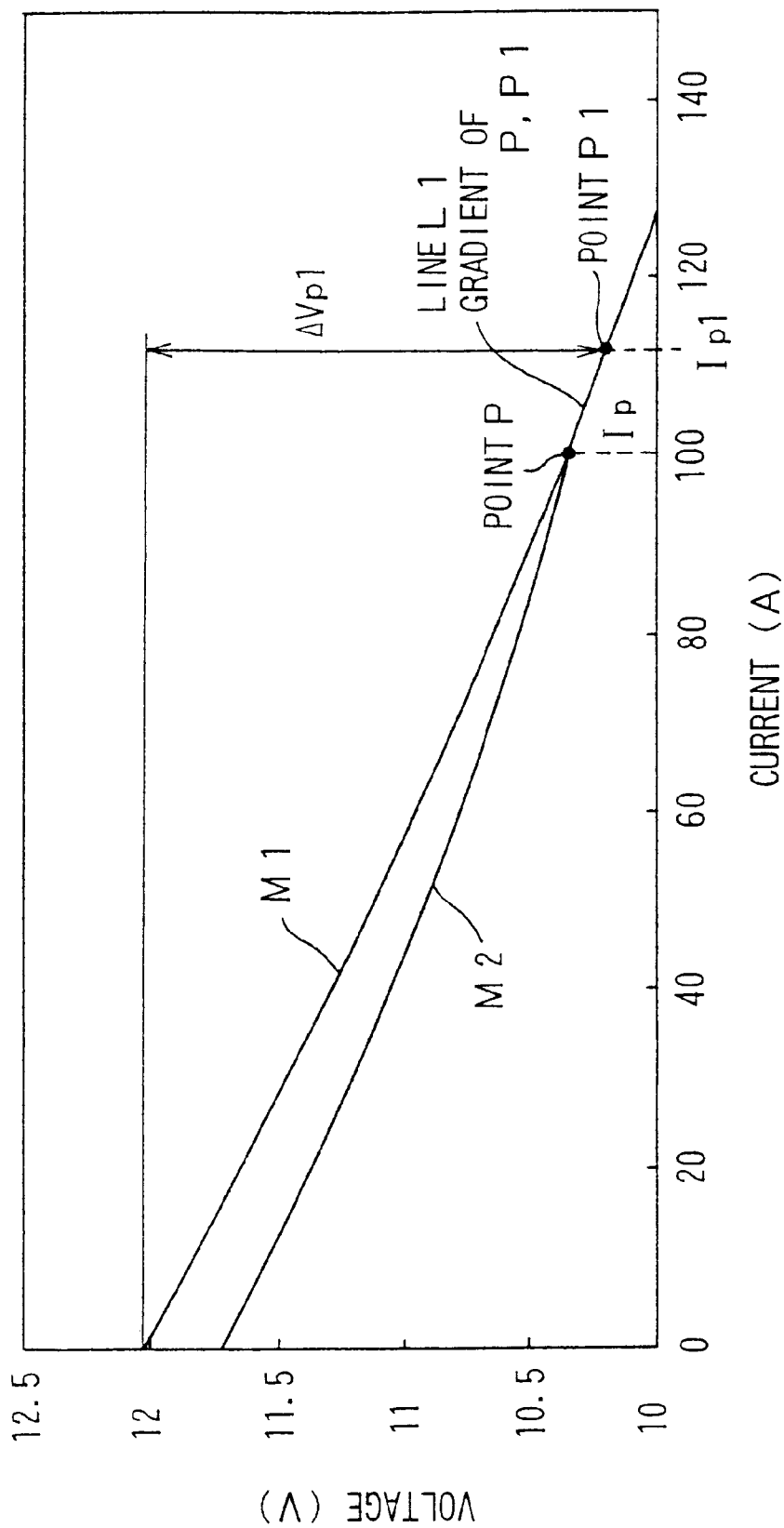
FIG. 17 is a graph for explaining the manner for defining an assumed point for the one approximate characteristic curve and the manner for correcting the gradient between two points in the second process.

Incidentally, as shown in FIG. 17, point P1 with a value $(R+R_{pol}1')$ equal to the combined resistance $(R+R_{pol}2)$ at point P set on the approximate curve M2 is located on the approximate curve M1. Further, as shown in FIG. 17, point P2 with a value $(R+R_{pol}2')$ equal to the combined resistance at point P selected on the approximate curve M1 is located on the approximate curve M2. Namely, point P1 where $R+R_{pol}1'=R+R_{pol}2$ is located on the approximate curve M1, whereas point P2 where $R+R_{pol}1=R+R_{pol}2'$ is located on the approximate curve.

In short, assuming that the current and voltage at point P1 are Ip1 and Vp1, and that the current and voltage at point P2 are Ip2 and Vp2, the polarization resistances at point P1 of the coordinates (Ip1, Vp1) and point P of the coordinates (Ip, Vp) are equal to each other, and the polarization resistances at point P of the coordinates (Ip, Vp) and at point P2 of the coordinates (Ip2, Vp2) are equal to each other.

An explanation will be given of the manner of computing the current Ip1 and voltage Vp1 at point P1 with the resistance $(R+R_{pol}1')$ equal to the combined resistance $(R+R_{pol}2)$ at point P.

The voltage drop $\Delta Vp1$ from the intercept C1 where the approximate curve M1 crosses the ordinate to point P1 can be expressed by $$\Delta Vp1=C1-(a1Ip1^2+b1Ip1+C1)=(R+R_{pol}2)Ip1$$

Therefore, $$-(a1Ip1+b1)=R+R_{pol}2$$

Thus, the current Ip1 at point P1 is expressed by $$Ip1=-(b1+R+R_{pol}2)/a1$$

Since $R+R_{pol}2(=R+R_{pol}1')=\Delta V2/I2(=\Delta Vp1/Ip1)$, $$Ip1=-[b1+(\Delta Vp/Ip)]/a1$$

$$=-[b1+(\Delta Vp1/Ip1)]/a1$$

As apparent from the above equation, the voltage Vp1 at point P1 is expressed by $$Vp1=a1Ip1^2+b1Ip1+C1$$

Thus, the coordinates (Ip1, Vp1) of point P1 are computed by known values.

Likewise, the current Ip2 and voltage Vp2 at point P2 with a value $(R+R_{pol}2')$ equal to that $(R+R_{pol}1)$ at point P are expressed by $$Ip2=-[b2+(\Delta V2/I2)]/a2$$

$$=-[b2+(\Delta Vp2/Ip2)]/a2$$

$$Vp2=a2Ip2^2+b2Ip2+C2$$

Thus, the coordinates (Ip2, Vp2) can be computed by known values.

$\Delta Vp2$ represents the voltage drop from the intercept C2 where the approximate curve M2 crosses the ordinate.

Thereafter, as seen from FIG. 17, the gradient of a line L1 connecting point P1 of the coordinates (Ip1, Vp1) and point P of the coordinates (Ip, Vp) is acquired to provide the combined resistance R1. The combined resistance R1 is acquired by dividing the voltage difference (Vp1−Vp) produced by the combined resistance (composed of the pure resistance and the polarization resistance $R_{pol}2$) by current difference (Ip1−Ip). Namely, $$R1=(Vp1-Vp)/(Ip1-Ip)$$

Figure 18:
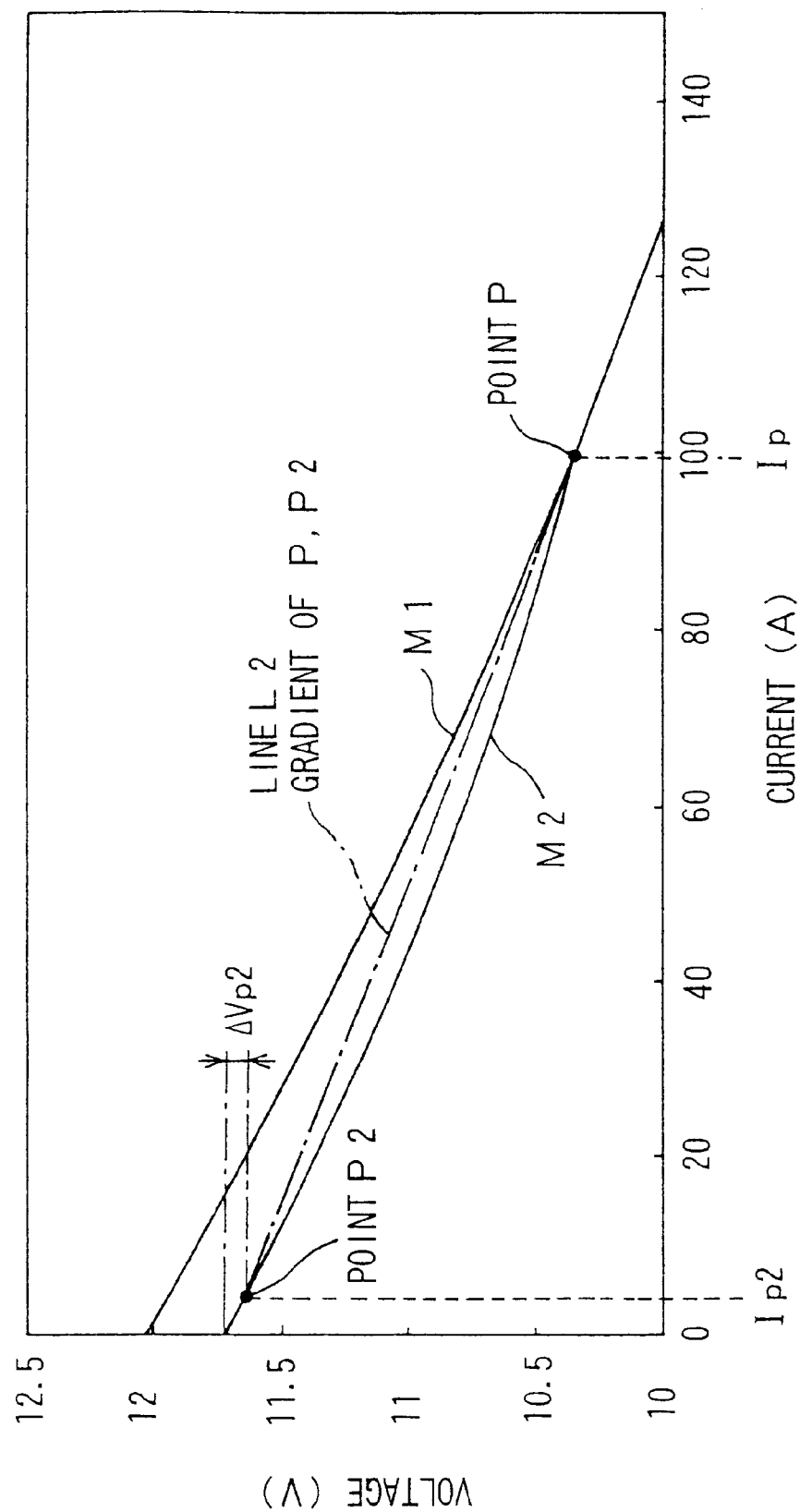
FIG. 18 is a graph-for explaining the manner for defining an assumed point for the other approximate characteristic curve and the manner for correcting the gradient between two points in the second process.

Likewise, as seen from FIG. 18, the gradient of a line L2 connecting point P2 of the coordinates (Ip2, Vp2) and point P of the coordinates (Ip, Vp) is acquired to provide the combined resistance R1. The combined resistance R2 is acquired by dividing the voltage difference (Vp−Vp2) produced by the combined resistance (composed of the pure resistance and the polarization resistance $R_{pol}1$) by current difference (Ip−Ip2) Namely, $$R2=(Vp-Vp2)/(Ip-Ip2)$$

However, the combined resistances R1 and R2 are not coincident to pure resistances. This inconvenience can be overcome by dividing the voltage drop exclusive of that due to the polarization resistance.

With reference to point P of the approximate curve M2, assuming that the combined resistance R1 is expressed by $$R1=R1'+R_{pol}2=R1'+R_{pol}1',$$

the voltage drop produced when the current corresponding to a difference between the current Ip1 at point P1 and the Ip at point P flows through the resistance R1' should be incrementally compensated for, at the voltage at point P1, by the voltage drop produced when a current corresponding to a difference between the current Ip1 at point P1 and the current Ip at point P2 flows through the polarization resistance $R_{pol}1'$ (or $R_{pol}2$).

Hence, the following equation holds.

$$R1'(I1'-I2)=(V1'+R_{pol}1'(I1'-I2)]-V2$$

Hence, $$R1'(I1'-I2)=(Vp1-Vp)+R_{pol}1'(Ip1-Ip)$$

Now, since $R_{pol}1'=\Delta V1'/Ip1-R1'$ $$R1'(Ip1-Ip)=(Vp1-Vp)+(\Delta Vp1/Ip1-R1')(Ip1-I2)$$

$$2R1'(Ip1-I2)=(V1'-Vp)+\Delta Vp1/Ip1(Ip1-Ip)$$

As a result, $$R1'=[(Vp1-Vp)+(\Delta Vp1/Ip1)(Ip1-Ip)]/2(Ip1-Ip)$$

Incidentally, it should be noted that ($\Delta$Vp1/Ip1) can be replaced by ($\Delta$V2/Ip).

Likewise, with reference to point P on the approximate curve M1, assuming that the combined resistance R2 is expressed by $$R2=R2'+R_{pol}1=R2'+R_{pol}2',$$

the voltage drop produced when the current corresponding to a difference between the current I1 at point A and the I2' at point B' flows through the resistance R2' should be detrimentally compensated for, at the voltage at point B', by the voltage drop produced when a current corresponding to a difference between the current I1 at point A and the current I2' at point B' flows through the polarization resistance $R_{pol}2'$ (or $R_{pol}1$), and hence the following equation holds.

$$R2'(Ip-Ip2)=Vp-[Vp2-R_{pol}2'(Ip-Ip2)]$$

Hence, $$R2'(I1-Ip2)=(Vp-Vp2)+R_{pol}2'(Ip-Ip2)$$

Now, since $R_{pol}2'=\Delta Vp2/Ip2-R2'$ $$R2'(Ip-Ip2)=(Vp-Vp2)+(\Delta Vp2/Ip2-Rp2)(Ip-Ip2)$$

$$2R2'(I1-Ip2)=(Vp-Vp2)+\Delta Vp2/Ip2(Ip-Ip2)$$

As a result, $$R2'=[(Vp-Vp2)+(\Delta Vp2/Ip2)(Ip-Ip2)]/2(Ip-Ip2)$$

Incidentally, it should be noted that ($\Delta$Vp/Ip) can be replaced by ($\Delta$V1/I1).

The two resistances R1' and R2' have been acquired with reference to the two points A and B using the different polarization resistances ($R_{pol}1'=R_{pol}2$) and ($R_{pol}1=R_{pol}2'$) and voltage drops $\Delta$Vp1($\Delta$Vp) and $\Delta$Vp2($\Delta$Vp) from the different intercepts C1 and C2, and hence cannot be pure resistances. Thus, by obtaining the weighted average of both resistances, $$R=(R1'+R2')/2$$

the real pure resistance R can be acquired.

In the method explained with reference to FIGS. 16 to 18, the single point may be set at point P corresponding to the maximum discharging current of the battery, which is measured to acquire the two approximate curves M1 and M2. Using the common data, inclusion of an error can be suppressed.

The first assumed point P1 is assumed on the first approximate curve M1, and the second assumed P2 is assumed on the second approximate curve M2. As described previously, the first assumed point P1 provides the same resistance as the second combined resistance R2 composed of the pure resistance of the battery and the second polarization resistance component $R_{pol}2$, which produces the second voltage drop $\Delta$V2 when the discharging current Ip corresponding to point P on the second approximate curve M2 flows. The second assumed point P2 provides the same resistance as the first combined resistance R1 composed of the pure resistance of the battery and the first polarization resistance component $R_{pol}1$, which produces the first voltage drop $\Delta$V1 when the second discharging current Ip corresponding to point on the first approximate curve M1 flows.

When the two assumed points P1 and P2 could be assumed appropriately, the first gradient R1 of the line L1 connecting point P and the first assumed point P1 is corrected by the voltage drop $R_{pol}2$(Ip1−Ip) due to the second polarization resistance component $R_{pol}2$, which are produced by the discharging current Ip and the discharging current Ip1 at the first assumed point P1, thereby providing the first corrected gradient R1' exclusive of the voltage drop due to the second polarization resistance component $R_{pol}2$. Likewise, the second gradient R2 of the line L2 connecting point P and the second assumed point P2 is corrected by the voltage drop $R_{pol}1$(Ip−Ip2) due to the first polarization resistance component $R_{pol}1$, which are produced by the discharging current Ip and the discharging current Ip2 at the second assumed point P2, thereby providing the second corrected gradient R2' exclusive of the voltage drop due to the first polarization resistance component $R_{pol}1$.

The first corrected gradient R1' and the second corrected gradient R2' are summed and the sum is averaged to provide an average gradient. The average gradient thus provided is measured as a pure resistance of the battery.

This embodiment can be executed in substantially the same processing as illustrated in the flowcharts of FIGS. 14 and 15 with the first embodiment explained with reference to FIGS. 11 to 13, except that the two points on the approximate curves M1 and M2 are set at the same point corresponding to the maximum value of the discharging current of the battery on the two approximate curves M1 and M2.

The aforementioned embodiment uses NVM 25 as the full charged state resistance storing device. However, such a device can be replaced by providing an area in ROM 23c of the microcomputer 23 for storing a full charged state resistance Rf+$R_{pol}$f.

As an embodiment of the invention, the on-vehicle battery charged electrical quantity computing unit 1 of the battery 13 has been discussed hereinabove. Of course, the present invention can be applied to a computing unit of the battery 13 for obtaining a charging efficiency that is a ratio of an actually charged electrical quantity to a total electrical quantity flown into the battery 13.

In the case of the on-vehicle battery charging efficiency computing unit, a battery charging efficiency (%) at each measuring point during the charging may be stored in a NVM. A full charged state resistance Rf+$R_{polf}$ of the battery 13 may be also stored in the NVM.

In addition, the present invention is not limited in computing a charging efficiency and a charged electrical quantity of an on-vehicle battery but also can be applied to a general application such as a portable telephone and a portable personal computer.

What is claimed is:

1. A method for computing a charging efficiency, which is a ratio of an electrical quantity charged in a battery as an electromotive force to a total electrical quantity supplied to the battery, at any one point in time between a start and an end of charging of the battery, the method comprising:

measuring an initial resistance of the battery at the start of the charging, measuring a voltage and a current between a pair of terminals of the battery at the one point to obtain an inner resistance of the battery at the one point, obtaining a resistance difference which is a difference of the inner resistance at the one point and the initial resistance, and obtaining a ratio of the resistance difference to a full charged state resistance that is a resistance of the battery at a full charged state of the battery, whereby, a charging efficiency of the battery at the one point is computed based on the ratio.

2. A method for computing a charging efficiency according to claim 1 wherein the ratio of the resistance difference to the full charged state resistance is deducted from 1 (one) to provide a charging efficiency at the one point.

3. A method for computing a charged electrical quantity of the battery according to claim 1, wherein a charged electrical quantity stored in the battery at the charging end of the battery is obtained by using a plurality of the charging efficiencies each obtained at each of a plurality of the measuring points in time between the start and the end of charging of the battery.

4. A method for computing a charged electrical quantity according to claim 1, wherein the battery has poles that are in an active state where no passivating film is formed on the poles, and whether the poles are in the active state is determined based on a pattern of the charging current varying with time during the charging, the charged electrical quantity charged in the battery being obtained by using a plurality of the charging efficiencies each obtained at each of a plurality of the measuring points in time between the start and the end of charging of the battery when the poles are in the active state, the charged electrical quantity of the battery being obtained based on an integration of a charging current multiplied by a corresponding charging time during a transition period in which a passivating film remains on the poles of the battery before the charging current sufficiently breaks the passivating film.

5. A unit for computing a charging efficiency, which is a ratio of an electrical quantity charged in a battery as an electromotive force to a total electrical quantity supplied to the battery, at any one point in time between a start and an end of charging of the battery, the unit comprising:

a measuring device for measuring a voltage and a current between a pair of terminals of the battery at the one point to obtain an inner resistance of the battery at the one point, an initial resistance computing device for obtaining an inner resistance of the battery at the charging start based on a terminal voltage and the corresponding current which are measured by the measuring device, an on-charging resistance computing device for obtaining an inner resistance of the battery at the one point based on a terminal voltage and a corresponding current which are measured by the measuring device, a resistance difference computing device for obtaining a difference between of the inner resistance at the one point and the initial resistance, a storage device for storing an inner resistance at a full charged state of the battery, and a resistance ratio computing device for obtaining a ratio of the resistance difference to the full charged state resistance, whereby, a charging efficiency of the battery at the one point is computed based on the ratio.

6. A unit for computing a charging efficiency according to claim 5 wherein the resistance ratio computing device deducts the ratio of the resistance difference to the full charged state resistance from 1 (one) to provide a charging efficiency of the battery at the one point.

7. A unit for computing a charged electrical quantity according to claim 5, wherein a charged electrical quantity stored in the battery at the charging end of the battery is obtained by using a plurality of charging efficiencies each obtained at each of a plurality of sequential points in time between the start and the end of charging of the battery by means of the charging efficiency computing unit.

8. A unit for computing a charged electrical quantity according to claim 5, wherein the battery has poles that are in an active state where no passivating film is formed on the poles, and the charged electrical quantity computing unit further comprises:

an active state determining device for determining whether the poles are in the active state based on a pattern of the charging current varying with time during the charging, the charging current obtained by the measuring device, the charged electrical quantity charged in the battery being obtained by using a plurality of charging efficiencies each obtained at each of a plurality of sequential points in time between the start and the end of charging of the battery when the poles are in the active state, and a charged electrical quantity computing device for obtaining a charged electrical quantity during a transition period in which a passivating film remains on the poles of the battery so that the poles are not in the active state before the charging current sufficiently breaks the passivating film, the charged electrical quantity of the battery being obtained based on an integration of a charging current multiplied by a corresponding charging time during the transition period.

* * * * *